(12) United States Patent
Pfingsten et al.

(10) Patent No.: US 7,898,819 B2
(45) Date of Patent: Mar. 1, 2011

(54) COMPACT MODULAR CARD SYSTEM AND COMMUNICATIONS PROTOCOLS FOR A POWER CONTROLLER

(75) Inventors: Thomas Robert Pfingsten, Winona, MN (US); Stanton Hopkins Breitlow, Winona, MN (US); John Frederic Lemke, Houston, MN (US); Keith Douglas Ness, Winona, MN (US); Robert Allen Pape, Winona, MN (US); Larry Emil Tiedemann, Winona, MN (US); Theodore Thomas Von Arx, La Crescent, MN (US); Dale Thomas Wolfe, Trempealeau, WI (US); Matthew Francis Yender, Minnesota City, MN (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 764 days.

(21) Appl. No.: 11/784,518

(22) Filed: Apr. 6, 2007

(65) Prior Publication Data

US 2007/0293954 A1 Dec. 20, 2007

Related U.S. Application Data

(63) Continuation-in-part of application No. 11/656,930, filed on Jan. 23, 2007, now Pat. No. 7,826,232.

(60) Provisional application No. 60/761,162, filed on Jan. 23, 2006.

(51) Int. Cl.
*H05K 7/14* (2006.01)
*H05K 7/18* (2006.01)

(52) U.S. Cl. .................. 361/800; 361/788; 361/730

(58) Field of Classification Search .................. 361/752, 361/790, 797, 800, 756, 727, 737, 600, 679.01, 361/805, 748, 784, 796, 730, 788; 439/55, 439/59, 61, 65, 67, 69, 439, 625, 626, 629, 439/933, 936
See application file for complete search history.

(56) References Cited

U.S. PATENT DOCUMENTS

| | | | | |
|---|---|---|---|---|
| 5,093,985 A | * | 3/1992 | Houldsworth et al. | 29/830 |
| 5,969,965 A | * | 10/1999 | Byrne et al. | 363/144 |
| 6,049,449 A | * | 4/2000 | Cranston et al. | 361/679.58 |
| 7,342,807 B2 | * | 3/2008 | Mueller et al. | 361/796 |
| 7,447,762 B2 | * | 11/2008 | Curray et al. | 709/224 |
| 2002/0065898 A1 | * | 5/2002 | Leontiev et al. | 709/208 |
| 2006/0128171 A1 | * | 6/2006 | Schmidt et al. | 439/61 |
| 2006/0230296 A1 | | 10/2006 | Peterson et al. | |

FOREIGN PATENT DOCUMENTS

DE 20 2004 01818 5/2005
WO WO 2004/052064 A 6/2004

* cited by examiner

*Primary Examiner* — Hung S Bui
(74) *Attorney, Agent, or Firm* — Brinks Hofer Gilson & Lione

(57) ABSTRACT

A 1/16 DIN power controller configuration is provided that includes a housing, a circuit board carrier disposed within the housing and capable of engaging at least three circuit boards within the housing, a power supply circuit board disposed within the housing and engaged by the circuit board carrier, and a communications circuit board disposed adjacent the power supply circuit board within the housing and engaged by the circuit board carrier. The communications circuit board includes Ethernet/IP and/or Modbus TCP protocols, and in alternate forms includes RS-232 and RS-485 with Modbus RTU protocol, DeviceNet, Profibus DP, CanOpen, and/or EtherCat.

17 Claims, 26 Drawing Sheets

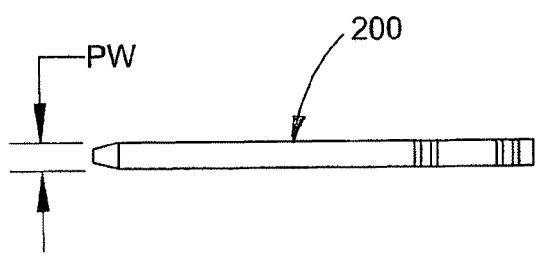
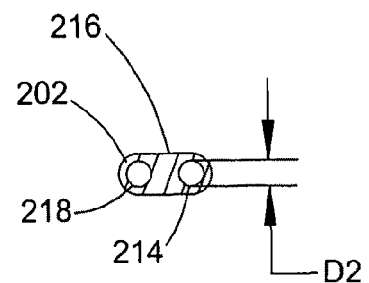
FIG. 5A  FIG. 5B
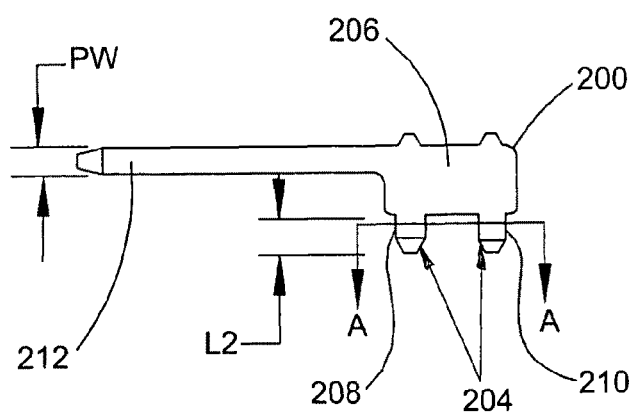
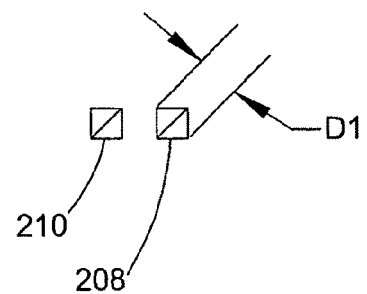
FIG. 5C  FIG. 5D

COMPACT MODULAR CARD SYSTEM AND COMMUNICATIONS PROTOCOLS FOR A POWER CONTROLLER

CROSS-REFERENCE TO RELATED APPLICATIONS

This application is a continuation-in-part of U.S. patent application Ser. No. 11/656,930 filed on Jan. 23, 2007. The disclosure of the above application is incorporated herein by reference.

FIELD

The present disclosure relates to panel-mounted controllers and more particularly, to the configuration and mounting of circuit board assemblies disposed within the controllers and various communications protocols used therein.

BACKGROUND

The statements in this section merely provide background information related to the present disclosure and may not constitute prior art.

Panel-mounted controllers are used throughout industry for various purposes, such as for heater, sensor, and/or power control purposes. Panel-mounted controllers are typically mounted on a control panel and/or in an electrical box and control and monitor features of a machine. Some examples of machines are industrial heaters, environmental chambers, injection molders, and packaging equipment, which are often located within a factory or manufacturing facility.

There are an abundant number of different assemblies and associated packaging for panel-mounted controllers. The assemblies and elements thereof are application specific and thus are designed, sized and configured for a particular process. Each assembly includes one or more circuit boards, a display, and a variety of internal and external electrical connecting elements, such as terminals, headers, and connectors. The circuit boards may include power supply cards, control loop cards, communication cards and other cards. The electrical connecting elements have application specific terminal and pin layouts and alignment geometries. Each assembly may also include a housing, which is configured to mount on a panel and/or in an electrical box. As a result, there are an abundant number of different components and parts that need to be stocked for the production and maintenance of panel-mounted controllers.

A demand exists to increase features and functionality of panel-mounted controllers. With increased features and functionality comes increased circuitry, which requires increased circuit board surface area and an increased number of input and output terminals. However, current panel-mounted controller designs, for a given package size, are limited in the number and size of circuit boards and in the number of terminals that can be incorporated therein.

SUMMARY

In one form, the present disclosure provides a 1/16 DIN power controller that comprises a housing, a circuit board carrier disposed within the housing and capable of engaging at least three circuit boards within the housing, a power supply circuit board disposed within the housing and engaged by the circuit board carrier, and a communications circuit board disposed adjacent the power supply circuit board within the housing and engaged by the circuit board carrier. In one form thereof, the communications circuit board comprises at least one of Ethernet/IP and Modbus TCP protocols. In another form thereof, the communications circuit board comprises RS-232 and RS-485 with Modbus RTU protocol. In still another form thereof, the communications circuit board comprises a protocol selected from the group consisting of Devicenet, Profibus DP, CanOpen, EtherCat, Profinet, and USB.

In another form of the present disclosure, a 1/16 DIN power controller is provided that comprises a housing, a power supply circuit board disposed within the housing and having a plurality of electronic components mounted thereon, wherein the electronic components including relatively high electrically emitting electronic components. A communications circuit board is disposed adjacent the power supply circuit board, and the communications circuit board defines an open area substantially clear of electronic components to provide dielectric. The relatively high electrically emitting electronic components are disposed adjacent the open area of the communications circuit board.

In still another form of the present disclosure, a 1/16 DIN power controller is provided that comprises a power control circuit board, a communications circuit board disposed adjacent the power control circuit board, the communications circuit board comprising at least one of Ethernet/IP and Modbus TCP protocols, and a third circuit board disposed adjacent the communications circuit board.

Furthermore, a 1/16 DIN power controller is provided that comprises at least three circuit boards, at least one of the three circuit boards including a communications circuit board having at least one of Ethernet/IP and Modbus TCP protocols.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 5A is a top view of a terminal according to an exemplary embodiment of the present disclosure;

FIG. 5B is a side view of the terminal of FIG. 5A;

FIG. 5C is a top view of a terminal pad layout of the terminal of FIGS. 5A and 5B;

FIG. 5D is an end view of terminal mounting posts of the terminal of FIGS. 5A and 5B through sectional line A-A in FIG. 5A;

DETAILED DESCRIPTION

Figure 1:
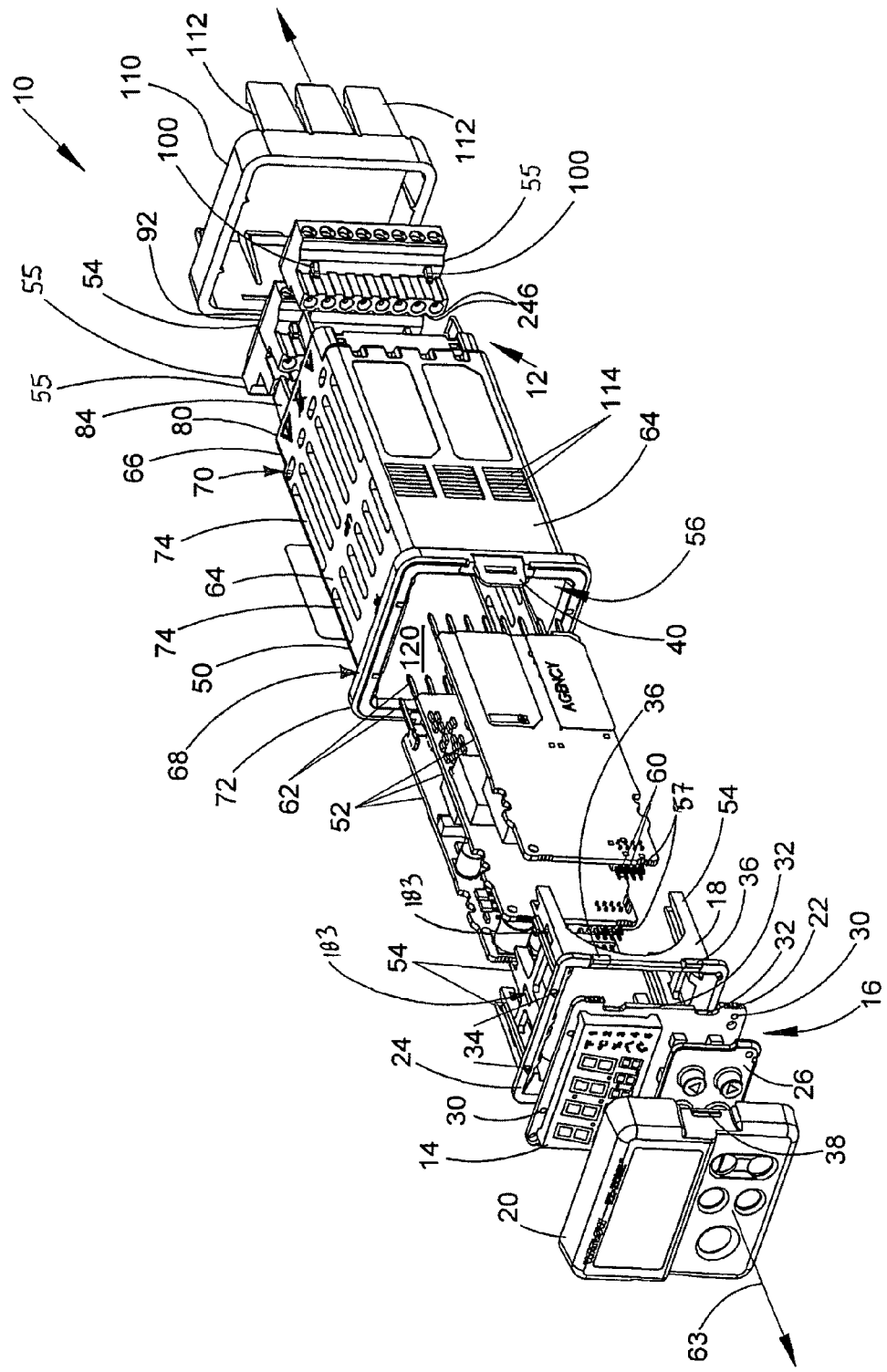
FIG. 1 is a front exploded and perspective view of a panel-mounted controller that incorporates a modular control system according to one exemplary embodiment of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

Although the following disclosed embodiments are primarily described with respect to panel-mounted controllers, the embodiments may be applied to other controllers and/or circuit board assemblies. For example, the embodiments may be applied to a controller having an enclosure or housing that is not mounted on or within an electrical box. The embodiments of the present invention may be applied to heater, sensor, environmental chamber, injection molder, packaging equipment, flow meter, motor, actuator, valve, or other processes or applications.

Figure 2:
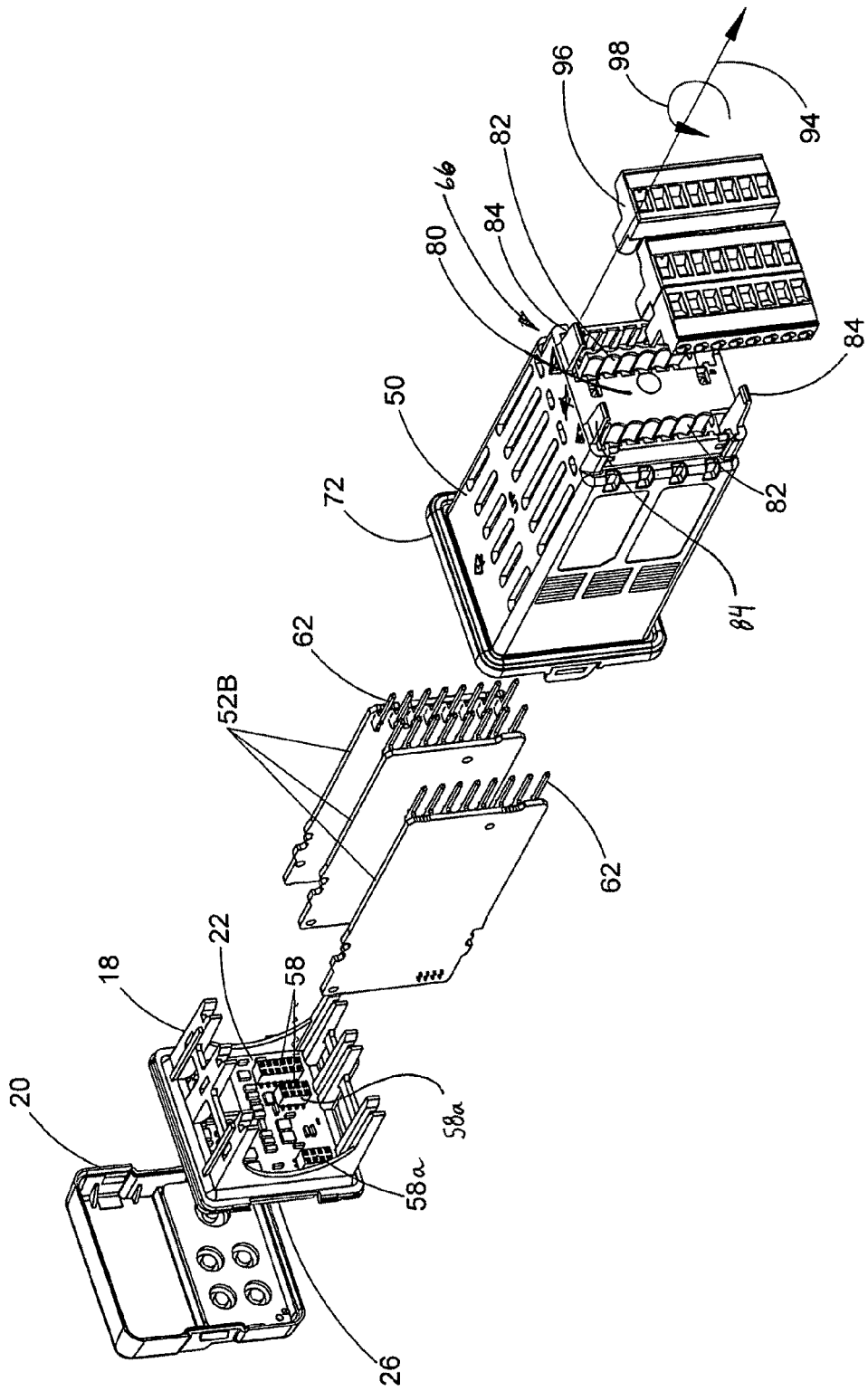
FIG. 2 is a rear exploded and perspective view of the panel-mounted controller of FIG. 1.
Figure 3:
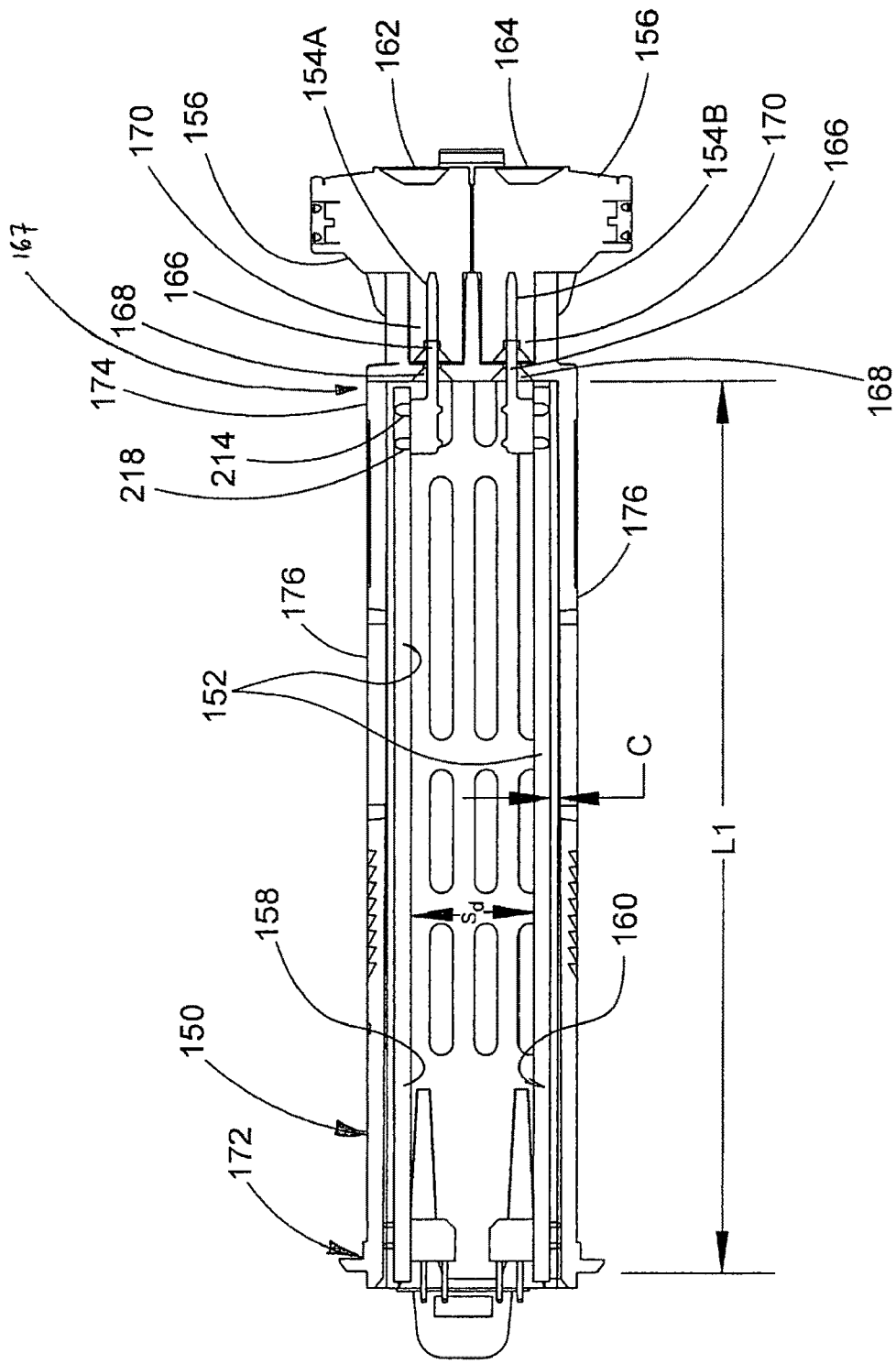
FIG. 3 is a side cross-sectional view of a panel-mount controller housing assembly according to another exemplary embodiment of the present disclosure.
Figure 11:
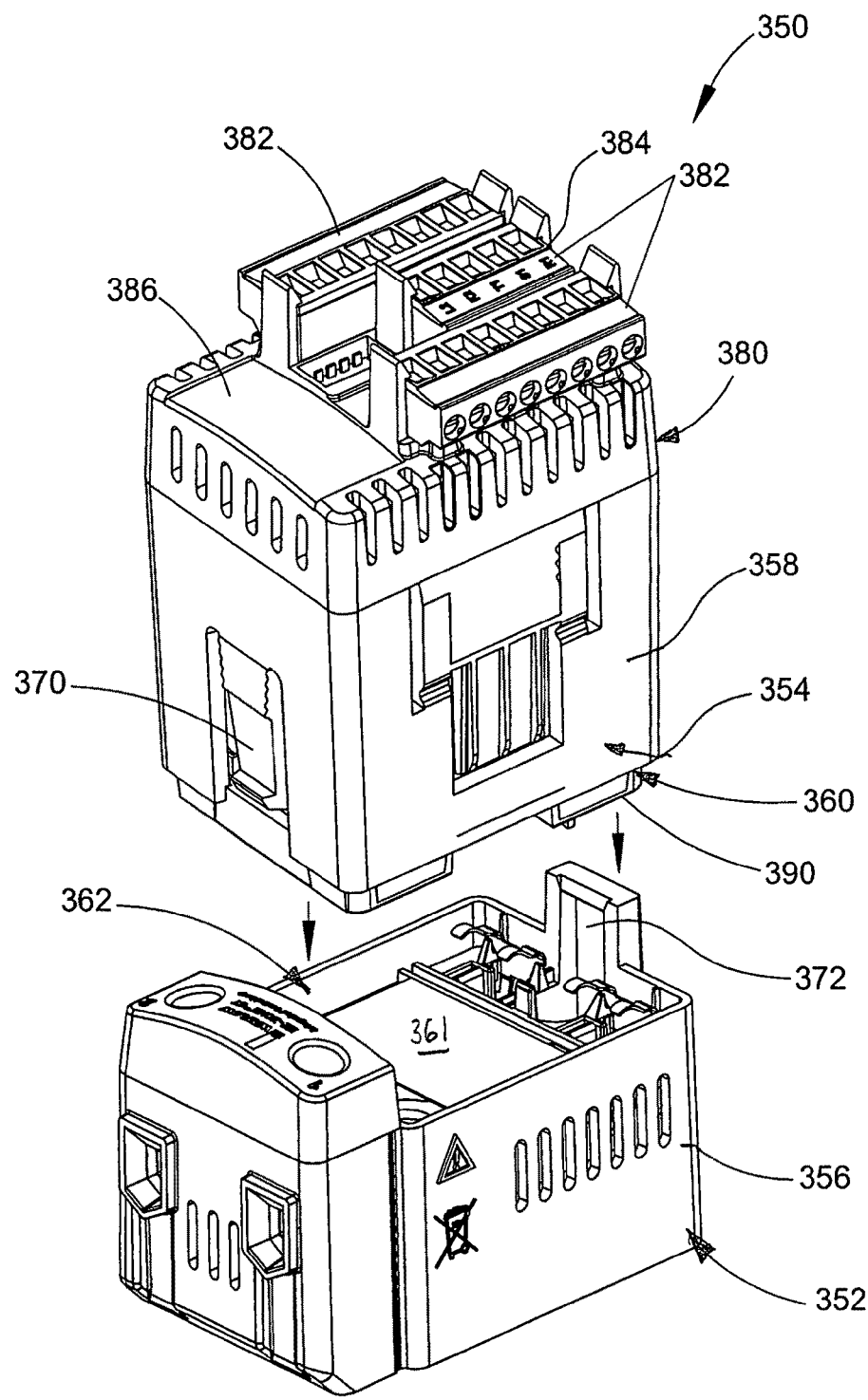
FIG. 11 is a perspective view illustrating an assembled stand-alone power controller according to an exemplary embodiment of the present disclosure.
Figure 12:
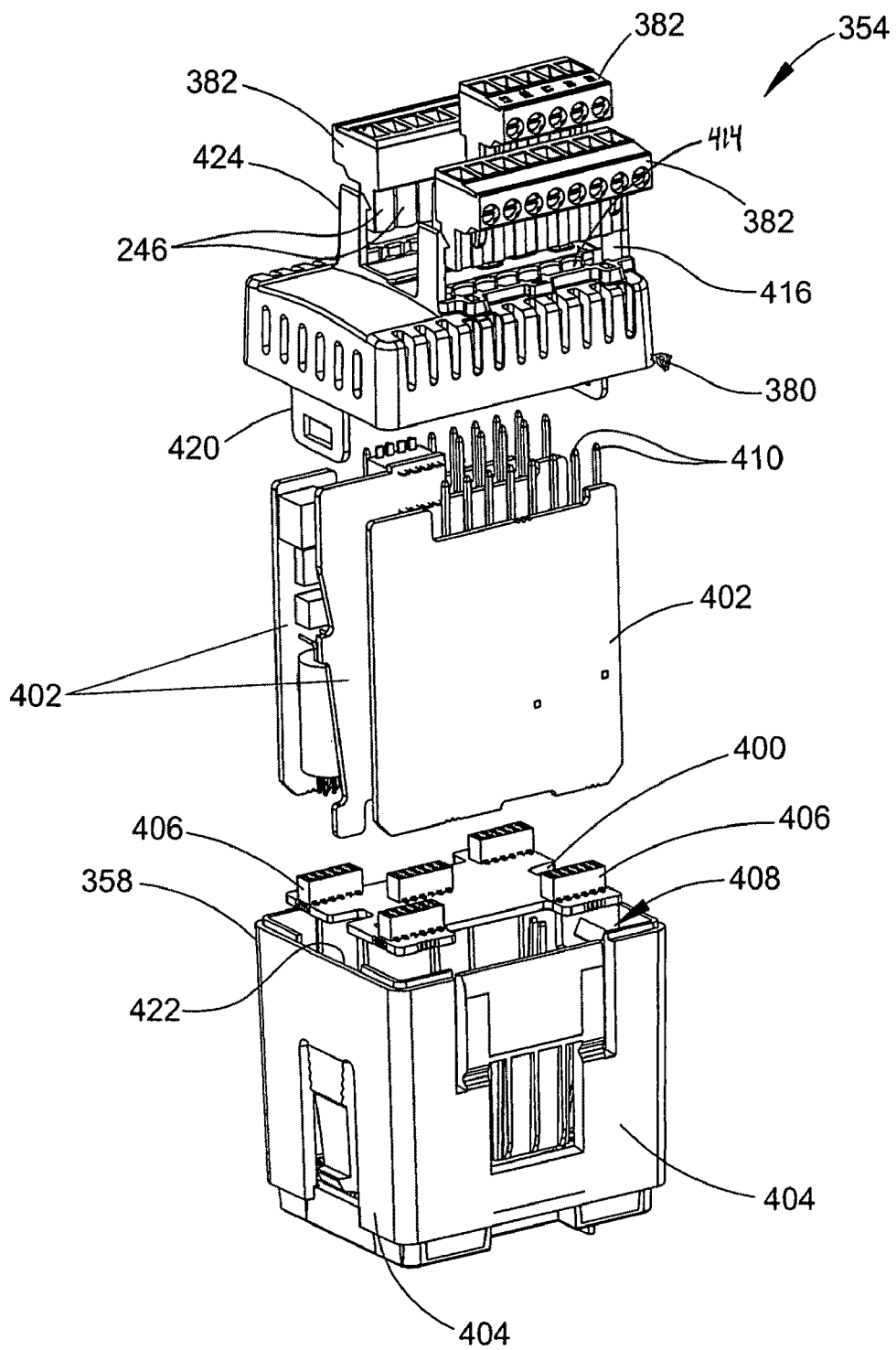
FIG. 12 is an exploded perspective view of a control module of the stand-alone power controller of FIG. 11.
Figure 20:
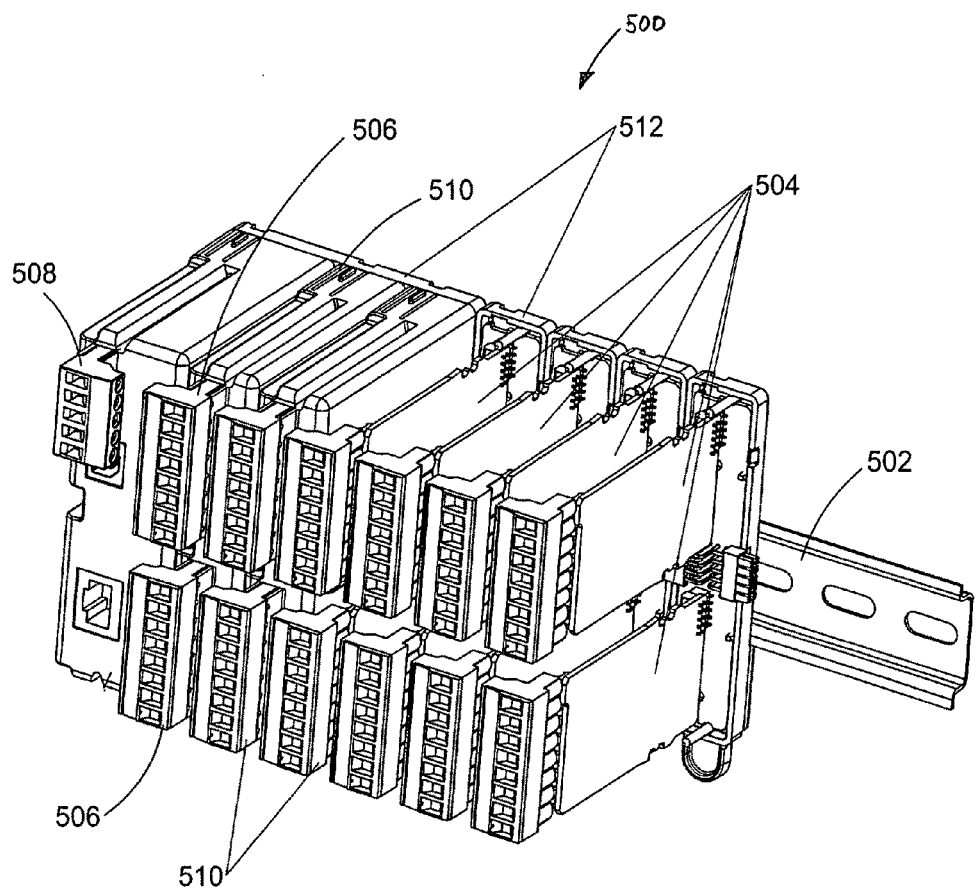
FIG. 20 is a perspective view of multiple circuit board connection assemblies installed on a common rail according to another exemplary embodiment of the present disclosure.

Examples of different panel-mounted controllers are shown and described with respect to the embodiments of FIGS. 1-3, 11, 12 and 20. The examples include door-mounted, electrical box internal-mounted, and rail-mounted controllers, as well as controllers of different DIN sizes. The panel-mounted controllers of FIGS. 1-3 are door-mounted controllers. The panel-mounted controller of FIGS. 1 and 2 is a ¹⁄₁₆$^{th}$ (or ¹⁄₁₆) DIN controller. The panel-mounted controller of FIG. 3 is a ¹⁄₃₂$^{nd}$ (or ¹⁄₃₂) DIN controller. The panel-mounted controller of FIGS. 11 and 12 is an electrical box internal-mounted controller that has a design specific size, but incorporates similar modular control system components as that of the panel-mounted controllers of FIGS. 1-3. The panel-mounted controllers of FIG. 20 are rail-mounted controllers, which may be mounted within an electrical box and incorporate the same or similar modular control system components as that of the panel-mounted controllers of FIGS. 1-3. The embodiment disclosed herein may be applied to panel-mounted controllers of various types and sizes. This will become more apparent in view of the following description.

Figure 23:
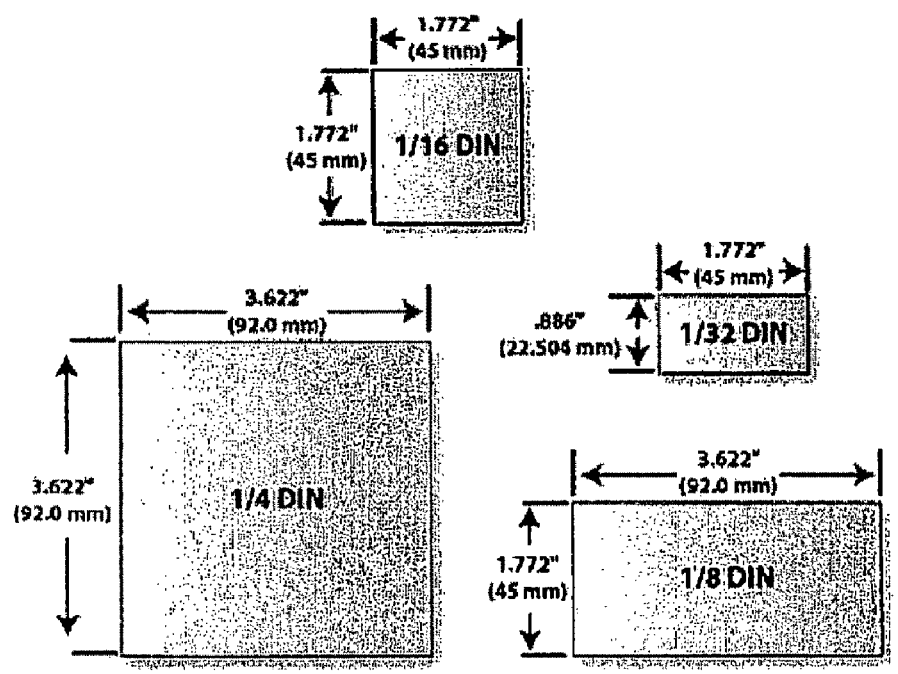
FIG. 23 is a diagram illustrating the standard dimensions of various DIN sizes (¼, ⅛, ¹⁄₁₆, and ¹⁄₃₂) for panel-mounted controllers as used in the industry.

In the following description the term "DIN" refers to an industry standard for panel-mounted controller sizes. The term DIN may refer to the size of a cutout opening in a panel that is allocated for a panel-mounted controller of a certain size. Some example standard DIN sizes are ¹⁄₃₂$^{nd}$, ¹⁄₁₆$^{th}$, ⅛$^{th}$, and ¼$^{th}$, which are illustrated in greater detail in FIG. 23.

Also, in the following description several different controller and component configurations, arrangements, and orientations are disclosed. These configurations, arrangements, and orientations are intended as examples only, other configurations, arrangements, and orientations are within the scope of the present invention and the descriptions herein are not intended to limit the scope of the invention.

Additionally, in the following description the term the term "a" shall be construed to mean one or more of the recited element(s), unless otherwise indicated or described.

Referring to FIGS. 1 and 2, front and rear exploded and perspective views of a panel-mounted controller 10 that incorporates a modular connection control system 12, which when associated with a particular application or group of applications may be referred to as a controller assembly, are shown. The panel-mounted controller 10 includes a display 14 and user interface 16 that are attached to the modular system 12 via a circuit board carrier 18 and a display cover 20. The display 14 and the user interface 16 are mounted on a supervisor (master) circuit board 22, which is coupled to the base 24 of the carrier 18. The display 14 and the user interface 16 provide information to and allow for input from a user via a keypad 26. The modular system 12 includes components that are modular, or in other words, allow for different assembly configurations, arrangements, and orientations thereof for use in different applications and package sizes. The modular system 12 and components thereof provide a standard by which controllers of different applications may be based. The exploded view illustrates the compactness and space efficiency of the stand-alone controller and the flexibility of the controller packaging.

The supervisor circuit board 22, the modular system 12, the carrier 18 and the display cover 20 may be keyed to assure proper alignment and orientation thereof during assembly. As shown, the supervisor circuit board 22 has alignment holes 30 and notches 32 to receive knobs 34 and tabs 36 of the carrier 18. The display cover is shaped to slide over the supervisor circuit board 22 and the carrier 18. The display cover 20 has clips 38 that connect to the modular system 12 via housing tabs 40.

The modular system 12 includes a controller housing assembly 50, (also referred to as a housing 50), one or more subordinate printed circuit boards (SPCBs) 52, and one or more block connectors 55. The SPCBs 52 may be referred to as minimum viable product (MVP) cards. The housing assembly 50 provides an inner circuit board cavity 56 in which the SPCBs 52 are disposed. The SPCBs 52 are mounted on the carrier 18 and are slid into the housing assembly 50. The carrier 18 has guides 54 that are designed for slidably engaging and holding each SPCB 52. Although a carrier 18 is shown, the housing assembly 50 may be modified such that a carrier is not used. For example, the housing assembly 50 may be modified to have slots or ribs formed therein, in or on which the SPCBs 52 may slide.

The SPCBs 52 slide in and are associated with one or more of the guides 54. The SPCBs 52 have a first set of block headers 57 that electrically couple to a second set of block headers 58 on the supervisor circuit board 22. The supervisor circuit board 22 performs as, may include, or may be replaced by an end fixture. An end fixture supports and couples to the SPCBs 52, but unlike a supervisor circuit board may have minimal or may not have electronic circuit elements. The first and second set of headers 57, 58 may have pins 60 (and corresponding sockets) that extend and provide electrical connections therebetween. The SPCBs 52 also have terminals 62 that are slid through the housing assembly 50 and are inserted into the block connectors 55.

As an example illustration of the modularity of the modular system 12, note that the SPCBs 52A of FIG. 1 are in a different location than the SPCBs 52B in FIG. 2. Thus, the housing assembly 50 and the block connectors 55 are rotated 180° about a centerline 63. Also, note that the terminals 62 may be mounted on a different side of the SPCBs 52. The modularity is further described below.

The housing assembly 50 includes multiple side members or walls 64 and a connecting portion 66. The side members 64 form the circuit board cavity 56. The side members 64 have a front portion 68 and a rear portion 70. The front portion 68 is open and is used to receive the SPCBs 52. The front portion 68 also has a peripheral frame 72 that supports the carrier 18 and is disposed within the display cover 20. The rear portion 70 is substantially closed off by the connecting portion 66. The members 64, 66 may have any number of air vents 74 for cooling purposes. The air vents 74 facilitate air flow cooling of circuit board electronics. The members 64, 66 may be integrally formed together as a single structural unit. The members 64, 66 may be formed of a plastic or polymer material or other suitable materials.

Figure 16:
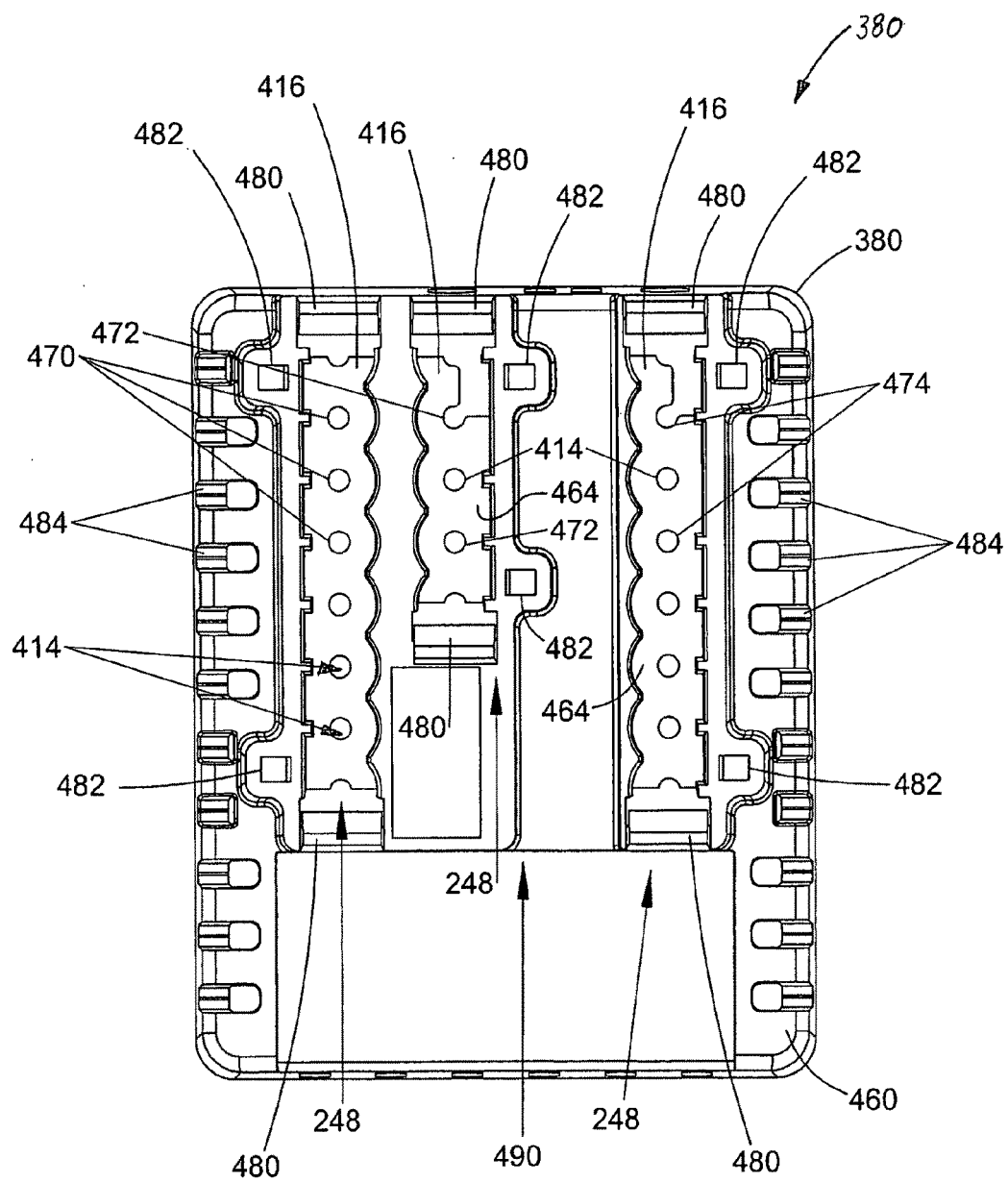
FIG. 16 is a rear view of a connector member of a housing assembly of the control module of FIG. 12.

The connecting portion 66 has an exterior side 80 with one or more slots 82. The slots 82 have electrical pin holes, examples of which are best seen in FIG. 16. The pin holes receive the terminals 62 from the interior cavity 56. The slots 82 receive the block connectors 55 from the exterior side 80. The terminals 62 extend through the pin holes, into the slots 82, and into the block connectors 55. The slots 82 may also be keyed to receive the block connectors 55 in one or more predetermined orientations. The connecting portion 66 has associated retainer clips 84 that lock and/or hold the block connectors 55 to the connecting portion 66 and assure connection maintenance between the terminals 62 and the block connectors 55.

Note that the block connectors 55 may be oriented on the connecting portion 66 in different positions. Depending upon the orientation of the slots 82, a first block connector 90 may be 180° rotated from and relative to a second block connector 92. The block connectors 55 may be rotated about the centerline 63 or about one or more axes that extend parallel to the terminals 62. An example of one such axis is shown and has numerical designator 94 and rotation of the block connector 96 is represented by arrow 98. The block connectors 55 may also be keyed to be inserted within the slots 82 in a particular orientation and have connector member clips 100. The block connectors 55 are described in further detail with respect to FIG. 6.

The housing assembly 50 may also include a panel-mounting bracket 110. During installation of the panel-mounted controller 10 on a door of an electrical box, the housing assembly 50 is slid through an opening on the door. The bracket 110 slides over the side members 64 and is pressed against an interior surface of the door. The peripheral frame 72 and the bracket 110 rigidly hold the housing assembly 50 on the door. The bracket 110 includes mounting support tabs 112, which clip onto and against ridges 114 formed in the side members 64, which is described in greater detail in copending U.S. application Ser. No. 11/337,339, filed on Jan. 23, 2006, and copending U.S. application Ser. No. 11/706,051, filed on Feb. 13, 2007, which are commonly owned with the present application and the contents of which are incorporated by reference herein in their entirety.

Additionally, the carrier 18 and interior surfaces 120 of the housing 50 are shaped and adapted for positioning the carrier 18 within the circuit board cavity 56. For example, the carrier 18 and circuit board cavity 56 can include orientation fixtures to selectively orient the carrier 18 within the circuit board cavity 56. As a result, the carrier 18 and the controller housing assembly 50 are cooperatively configured for positioning the SPCBs 52 within the circuit board cavity 56.

Components of the modular system 12, such as the carrier 18, the display 20, the supervisor circuit board 22, the housing assembly 50, the SPCBs 52, the block connectors 55 and the bracket 110, are easily assembled via a series of sliding engagements of the components. Disassembly is easily achieved by reversing the engagement sequence.

Referring to FIG. 3, a side cross-sectional view of another panel-mount (1/32 DIN) controller housing 150 and its various components is shown. The housing 150 is provided to show an example relationship between two SPCBs 152, F-terminals 154, and two block connectors 156. The first SPCB 158 is 180° rotated relative to the second SPCB 160. Likewise, the first block connector 162 is 180° rotated relative to the second block connector 164. A first set of F-terminals 154A is mounted on the first SPCB 158 and faces a second set of F-terminals 154B mounted on the second SPCB 160. This terminal arrangement saves space within the housing 150. As shown, the F-terminals 154 include pins 166, which extend through electrical pin holes 168 of the housing 150, and more specifically a connecting portion 167, and into pin receivers 170 of the block connectors 156.

The configuration of the SPCBs 152, F-terminals 154, and block connectors 156 allows for the incorporation of two full length circuit boards in a $1/32^{nd}$ DIN package. The term "full length" refers the internal length L1 of the housing 150. The SPCBs 152 extend from a front end 172 to a rear end 174 of the housing 150. This maximizes and allows for efficient utilization of space within the housing 150.

The housing 150 has side members or walls 176. Note that in the embodiment shown, the separation distance $S_d$ is maximized and the housing wall clearance C between the side walls 176 and the SPCBs 152 is minimized. This allows for efficient use of the package space associated with the housing 150.

Figure 4:
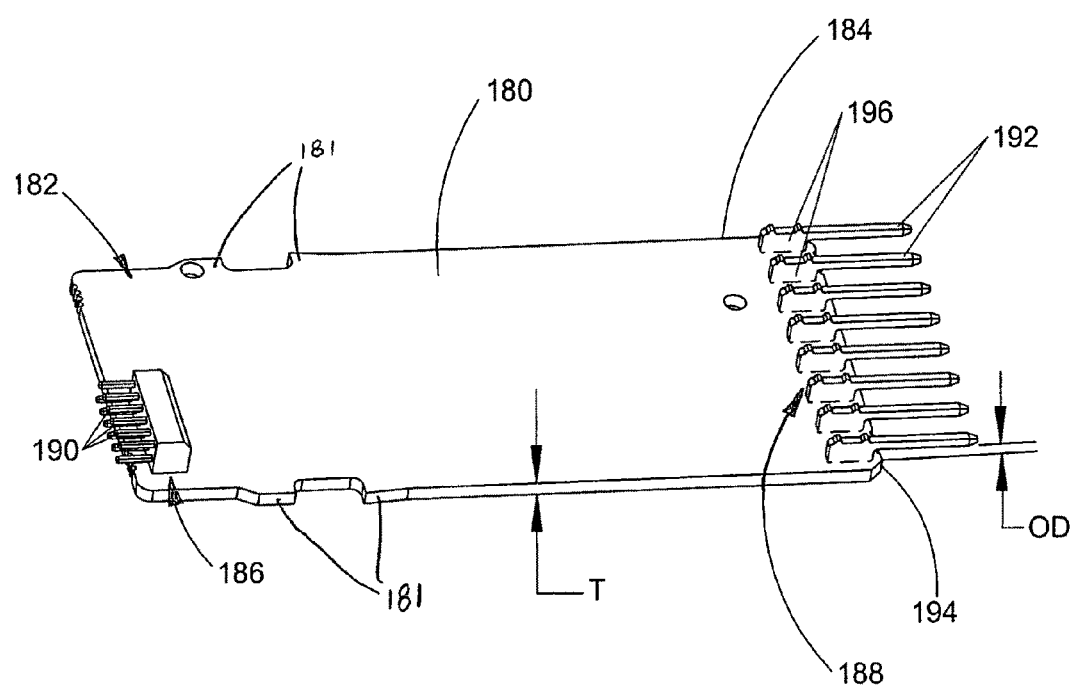
FIG. 4 is a perspective view of a subordinate printed circuit board according to an exemplary embodiment of the present disclosure.

Referring back to FIGS. 1 and 2, as well as FIG. 4, an SPCB 180 is illustrated and now described in greater detail. The SPCB 180 may replace one of the SPCBs 52 or 152. The SPCB 180 has a front end 182 and a rear end 184. In one form, the SPCB 180 is generally rectangular shaped and has a block header 186 that is surface mounted on the front end 182 and a set of F-terminals 188 that are surface mounted on the rear end 184. The block header 186, as shown has pins 190 that are received by a corresponding block header on a supervisor board, such as one of the block headers 58. The F-terminals 188 are 'F'-shaped, have a low profile, are isolated from each other, and are mounted in a parallel arrangement on the SPCB 180. The F-terminals 188 include pins 192 that extend rearward and out past an outer peripheral edge 194 of the SPCB 180.

Although the SPCB 180 has eight F-terminals that are equally spaced apart, any number of F-terminals may be incorporated and other separation configurations may be used. In one embodiment, the F-terminals 180 are spaced 5 mm apart from each other. The equal spacing of the F-terminals 180 allows for rotation of the SPCB 180 relative to a block connector and the interchangeability of block connectors. Although a majority of circuit board electrical components may be mounted on the same side as the F-terminals 180, electrical components may be mounted on either side of the SPCB 180. Also, the F-terminals 180 may be mounted on either side of and in other locations on the SPCB 180.

Note that the configuration and arrangement of the F-terminals 62 and the block connectors 96 eliminates the need for block header use in connecting to external devices. A block header is not used on the rear portion 70. This also allows for interchangeability and reorientation of SPCBs 52, 152, 180 relative to a supervisor circuit board, such as the supervisor circuit board 22. Although the SPCBs 52, 152, 180 may be reoriented, the modular systems disclosed herein minimize the need for such reorientation. Reorientation of the SPCBs 52, 152, 180 may result in location alteration of one or more associated block headers, such as the block headers 58, 186. Also, note that a similar F-terminal configuration and arrangement may be incorporated on the front end 182 to replace the block header 186. Of course, when F-terminals or the like are used on the front end 182, pin receivers are mounted on an associated supervisor circuit board to receive the F-terminals. The elimination of block headers saves PCB and packaging space. SPCBs 52, 180 may be tightly nested, which allows for the use of an increased number of SPCBs in a given packaging space.

Each SPCB 52, 152, 180 may be a power supply board, a control loop board, a communications board, a special or custom feature board, such as a limit control board, or other controller or non-controller circuit board. The SPCBs 52, 152, 180 may have proportional-integral-derivative (PID) components for feedback loop control and other controller components.

In one form, the pins 192 extend parallel to and from the SPCB 180. The pins 192 are offset from the SPCB 180 and are based on the dimensions of central bodies 196 the F-terminals 188. An offset dimension OD is shown and is determined based on a preselected number of block connectors to be incorporated in or coupled to a package of a controller assembly, package size, and block connector dimensions. In one embodiment, the offset dimension OD is between about 0.08 to about 0.085 inches. In another embodiment, the offset dimension OD is about 0.083 inches. Of course, the stated dimensions may vary per manufacturing tolerances and per application. This allows for the coupling of two block connectors 156 in a $\frac{1}{32}^{nd}$ DIN package and for the coupling of three block connectors 55 in a $\frac{1}{16}^{th}$ DIN package.

As further shown in FIG. 4, the SPCBs 180 also include extensions 181 that nest within corresponding apertures 183 within the guides 54 of the circuit board carrier 18. When the SPCBs 180 are inserted into the guides 54, the extensions 181 and their attendant geometry flexes the guides 54 outward until the extensions 181 fully engages the apertures 183. When the extensions 181 are engaged within the apertures 183, the guides 54 return to their original state/position and the SPCBs 180 are firmly locked in place.

Referring to FIGS. 5A-D, top and side views of a terminal 200, a top view of a terminal pad layout 202 of the terminal 200, and an end view of terminal mounting posts 204 are shown. The terminal 200 is an example of a terminal that may be used in the embodiments disclosed herein. The terminal 200 is an F-terminal and includes a central body 206 with a first mounting post 208, a second mounting post 210, and a pin 212 that extends therefrom. The terminal pad layout 202 in FIG. 5B provides an example representation of mounting post holes for a SPCB 216.

The first mounting post 208 is configured such that it has an interference fit with a first mounting hole 214 on the SPCB 216 or other circuit board. The first mounting post 208 has an interference fit to provide a durable mechanical coupling with the SPCB 216. This aids in maintaining a rigid fixed coupling that withstands repetitive insertion and removal from a block connector and/or pin receiver. The interference fit also maintains an electrical coupling between the F-terminal 200 and the circuit board 216.

The dimensions of the first mounting post 208 are larger or shaped differently than the inner dimensions of the first mounting hole 214, which provide the interference fit. In other words, the interference fit refers to when a mounting post is larger or shaped differently than the mounting hole in which it is to be inserted, such that there is an overlap of mounting post material over circuit board material. This overlap in material is overcome when press-fitting the mounting post into the mounting hole. For example, the first mounting post 208 may have square-shaped cross-section and the first mounting hole 214 may be circular-shaped. The first mounting post 208 may have a diagonal corner-to-corner dimension D1 that is larger than a diameter D2 of a first mounting hole 214. The first mounting post 208 is press fit into the first mounting hole 214 to create a tight coupling between the terminal 200 and the SPCB 216. The first mounting post 208 may also be soldered to the SPCB 216 to further increase the strength of the mechanically coupling of the first mounting post 208 to the SPCB 216.

The second mounting post 210 has a transitional fit with a second mounting hole 218 of the SPCB 216. The mounting holes 214, 218 are also shown in FIG. 3. A transitional fit refers to when a mounting post is dimensioned the same or smaller than that of a corresponding mounting hole. The second mounting post 210 is electrically coupled to an electrically conductive trace on the SPCB 216. The second mounting post 210 may be soldered to the SPCB 216 to provide an electrical coupling.

The mounting posts 204 have post lengths L2 that are approximately equal to the thickness of the SPCB 216, wherein the thickness of an SPCB is shown in FIG. 4 and designated T. This provides the mechanical and electrical couplings and minimizes extension of the posts 204 laterally outward from the SPCB 216. This also allows for electronic components to be mounted more easily on both sides of the circuit board. The mounting posts 204 may be formed of various conductive materials and coatings including nickel, copper, gold, or other conductive materials. The mounting posts 204 may also be formed of a non-conductive material and have a conductive coating thereon.

The end dimensions and the cross-sectional shape of the pin 212 may vary per application. As an example, a pin width PW is shown and may be approximately 0.39±0.006 inches. In one form, the pin 212, as shown, has a square-shaped cross-section.

Figure 6:
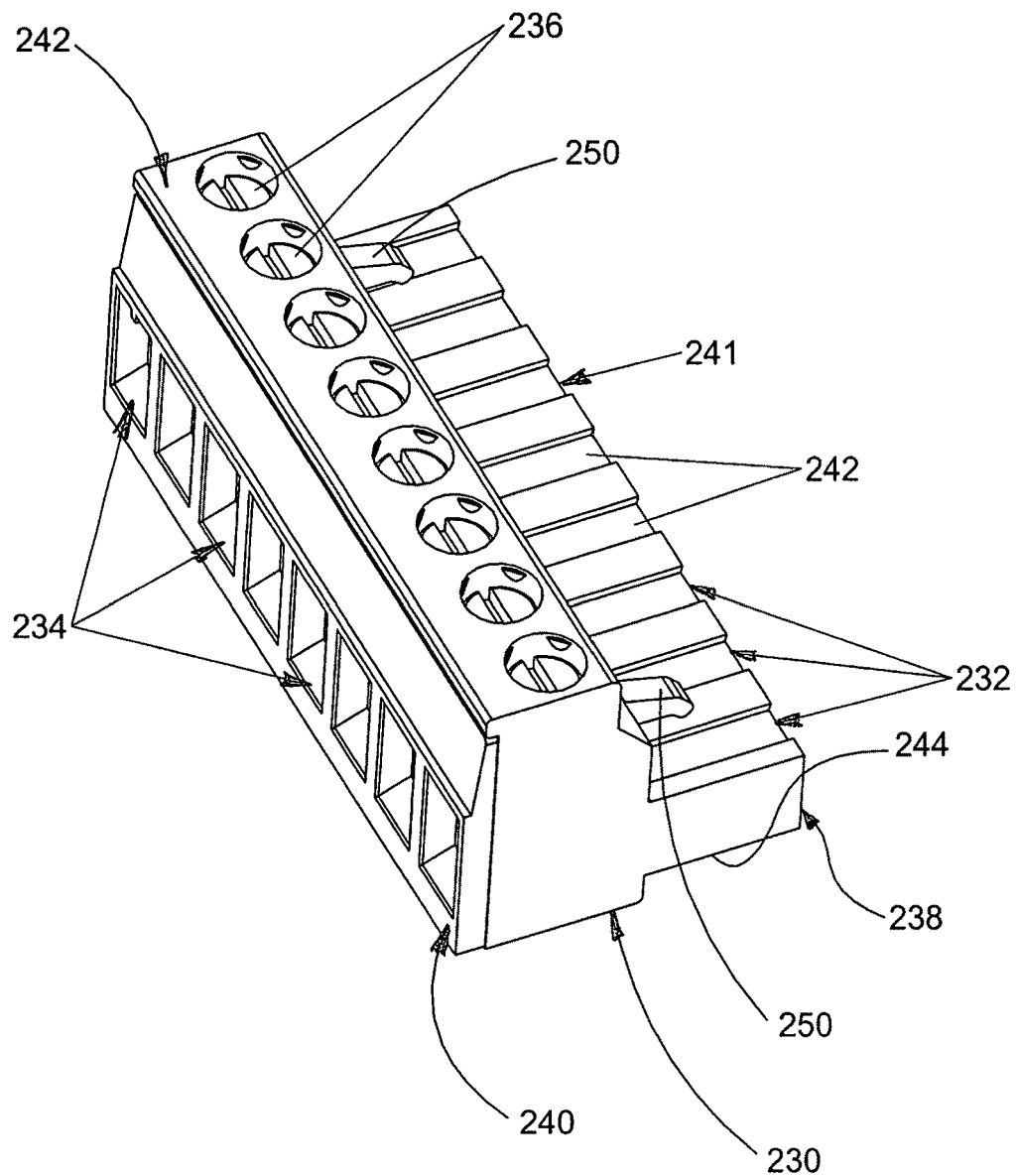
FIG. 6 is a perspective view of a block connector according to the embodiments of the present disclosure.

Referring to FIG. 6, a perspective view of a block connector 230 is shown. The block connector 230 is referred to as a right angle connector due to the body shape thereof and the arrangement of pin receivers 232, electrical lead receivers 234, and fasteners 236 thereof. The block connector 230 has a pin side 238, an external connection side 240, and an external lead fastener side 242, which have the pin receivers 232, the electrical lead receivers 234, and fasteners 236, respectively. Although eight pin receivers 232, eight electrical lead receivers 234, and eight fasteners 236 are shown, any number of each may be incorporated.

Each pin receiver 232 has inner dimensions to allow for a snug fit between a terminal pin, such as the pins 192 and 212, and metallic elements therein. This helps in providing an electrical contact between the pin receivers 232 and terminal pins. Each electrical lead receiver 234 may be parallel to one or more of the pin receivers 232. The electrical lead receivers 234 may receive wires, leads, pins, or other electrical connecting elements for communication with sensors, a communication and/or power bus, or other external electrical or electronic devices. A wire, for example, may be inserted into one of the electrical lead receivers 234 and be clamped down via one of the fasteners 236, which direct a clamping force perpendicular to the direction of insertion.

The pin side 238 includes one or more keyed portions. As shown, the block connector 230 includes a first keyed portion 241 having notches 242 and a second keyed portion 244 having semi-cylindrical elements, which are associated with each pin receiver 232. Examples of the semi-cylindrical elements 246 are best seen in FIGS. 1 and 12. The keyed portions 241, 244 have respective receiving areas of a slot, such as one of the slots 82 of FIG. 2, within a connector member and/or controller housing assembly. Examples of receiving areas 248 are best seen in FIG. 16.

The block connector 230 may also have clips 250, which may further perform as a third keyed portion. The clips 250 engage with the connecting portion 66 of a controller housing 50. This is described further below.

Figure 7:
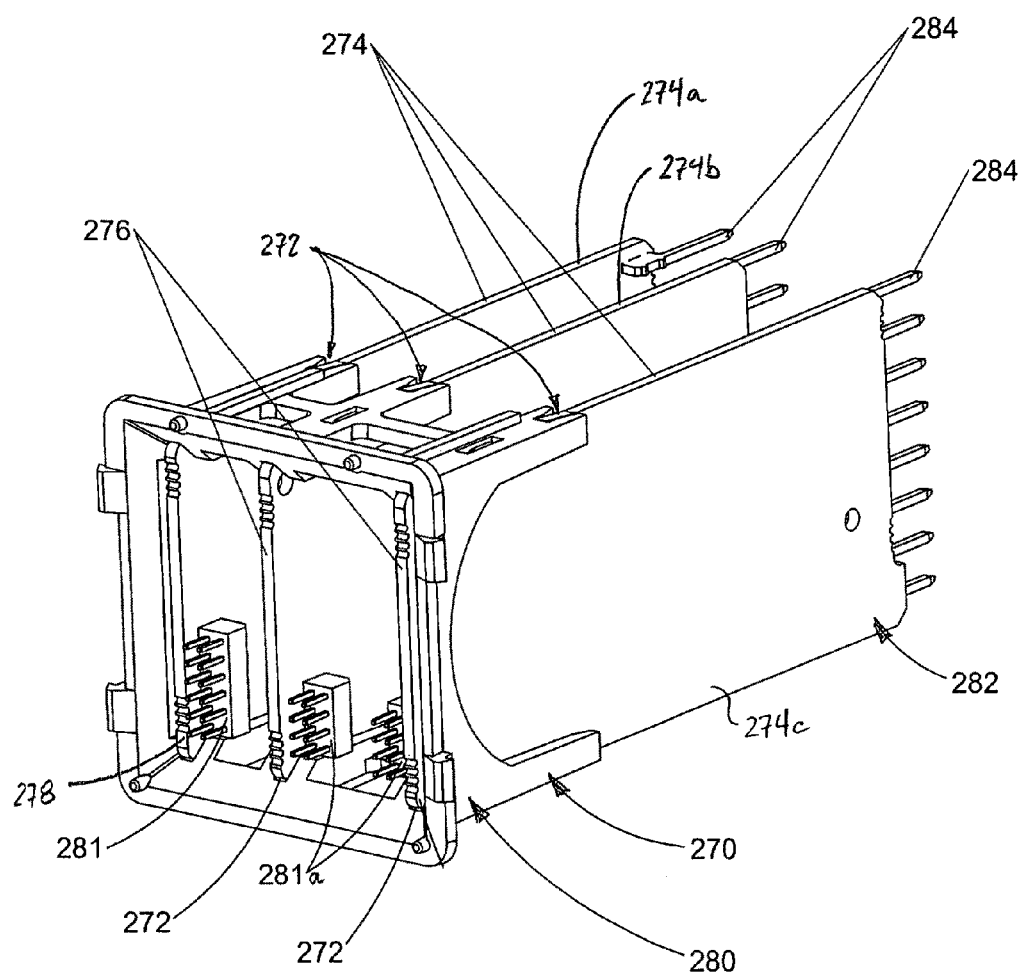
FIG. 7 is a perspective view of a carrier illustrating circuit board mounting thereon according to an exemplary embodiment of the present disclosure.

Referring to FIG. 7, a perspective view of a carrier 270 illustrating circuit board mounting thereon is shown. The carrier 270 has guide channels 272 in which SPCBs 274 engage. In the embodiment shown, three SPCBs slide within three guide channels. The guide channels 272 are spaced to accommodate two right-handed circuit boards 276 and a left-handed circuit board 278. An SPCB that has evenly distributed terminals across an end, such as the SPCBs 274, is considered right-handed or left-handed as follows. SPCBs that have a block header on a right side of a circuit board surface, when viewed on the F-terminal side of the circuit board with the pins of the F-terminals pointing in an upward direction, are described as having a right hand orientation. Similarly, SPCBs with a block header on a left side of a circuit board surface are described as having a left hand orientation.

The right and left-handed circuit boards 276, 278 are configured to face each other, which conserves on space. Each of the SPCBs 274 is also configured to engage to a supervisor board at a first end 280 via block headers 281 and to couple block connectors at a second (opposing) end 282 via F-terminals 284. In addition to being mechanically interchangeable, the block headers 281a and corresponding block headers 58a (FIG. 2) are also electrically and software interchangeable in accordance with the principles of the present disclosure. The interface between these headers is serially configured to provide a smaller physical space and lower cost, and therefore, the electrical connection scheme amongst the boards is also interchangeable.

Figure 8:
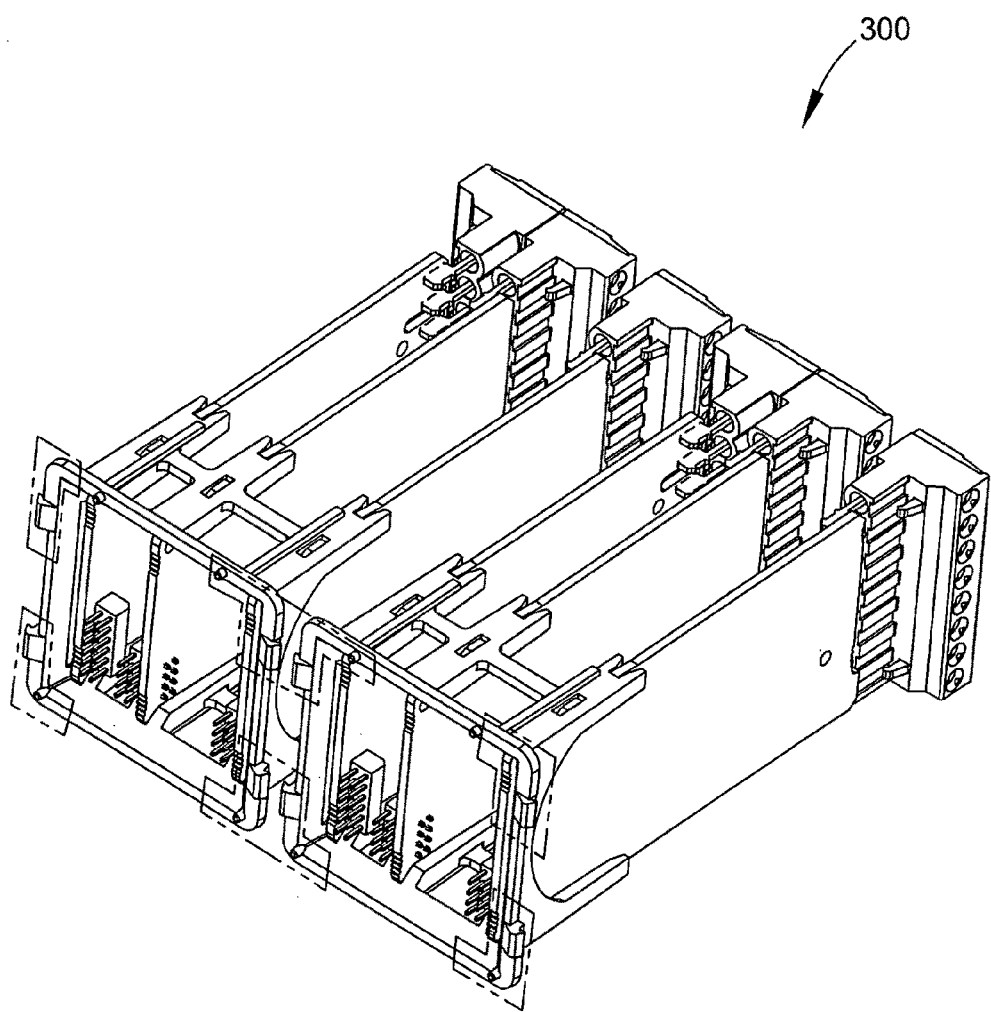
FIG. 8 is a perspective view of a ⅛$^{th}$ DIN assembly in a horizontal arrangement and according to an exemplary embodiment of the present disclosure.
Figure 9:
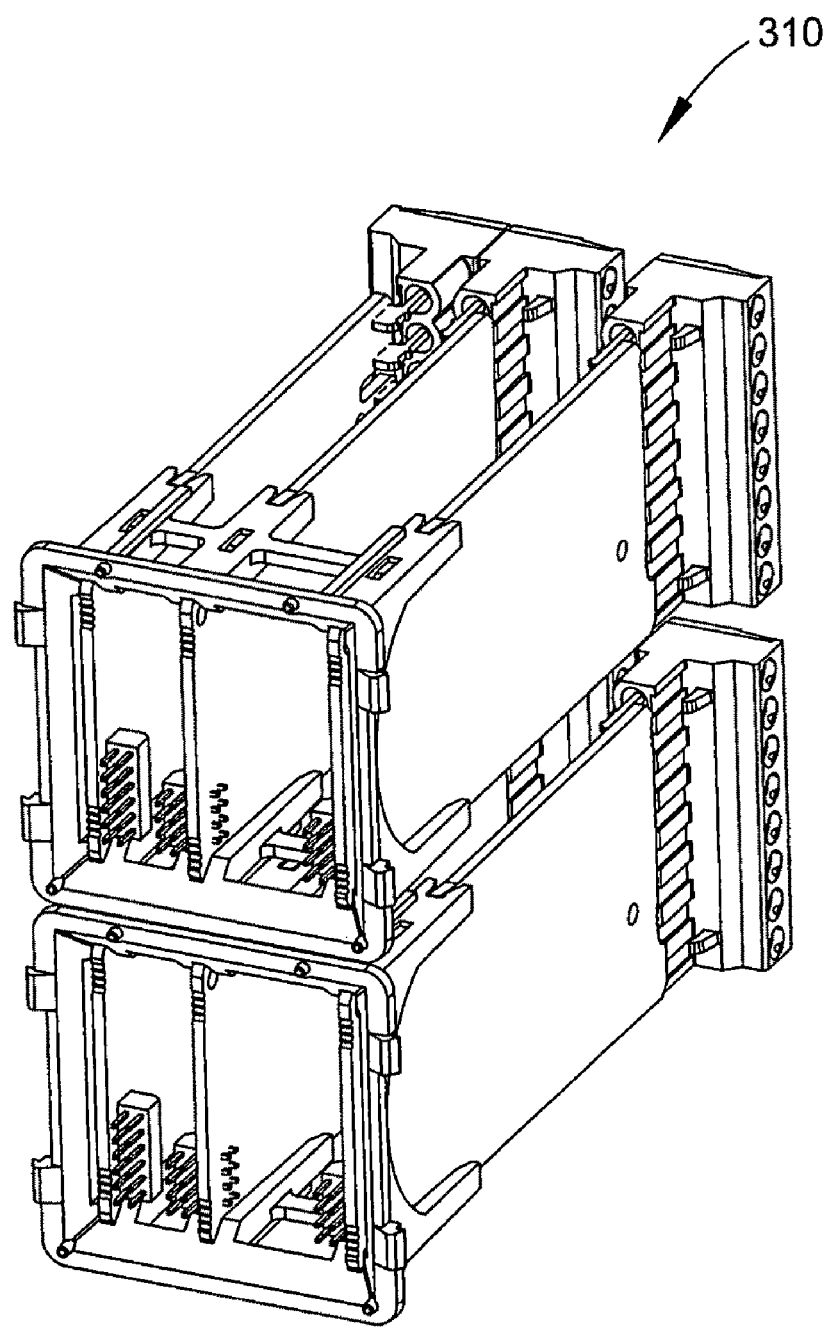
FIG. 9 is a perspective view of a ⅛$^{th}$ DIN assembly in a vertical arrangement and according to an exemplary embodiment of the present disclosure.
Figure 10:
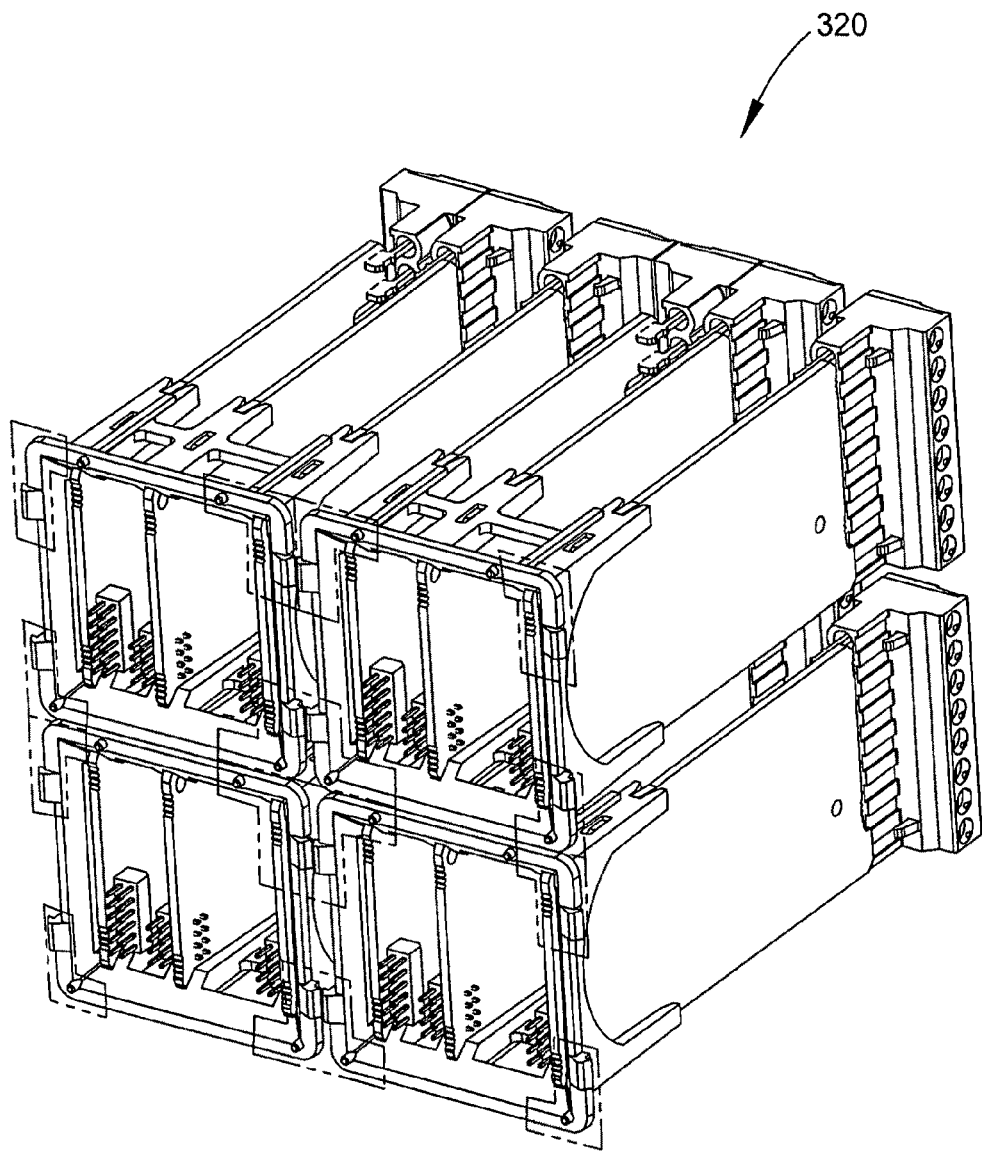
FIG. 10 is a perspective view of a ¼$^{th}$ DIN assembly according to an exemplary embodiment of the present disclosure.

Referring to FIGS. 8-10, perspective views of $\frac{1}{8}^{th}$ DIN assemblies in horizontal and vertical arrangements and a perspective view of a $\frac{1}{4}^{th}$ DIN assembly are shown. FIGS. 8-10 provide illustrated examples of other applications in which the modularity of the circuit board, terminals, and block connector configurations disclosed herein may be implemented. FIGS. 8 and 9 show dual carrier, five card, five block connector arrangements. A horizontal $\frac{1}{8}^{th}$ DIN assembly 300 is shown in FIG. 8 and a vertical $\frac{1}{8}^{th}$ DIN assembly 310 is shown in FIG. 9. FIG. 10 shows a quad carrier, 10 card, 10 block connector arrangement for a $\frac{1}{4}^{th}$ DIN assembly 320. Note that multiple carriers may be used and coupled together with increased DIN size, as shown, or a single carrier may be formed to serve the same purpose.

The following embodiments of FIGS. 11 and 12 illustrate another example of the integration, compactness, modularity and flexibility of the assembled controller elements disclosed herein. Referring to FIG. 11, a perspective view illustrating an assembled stand-alone power controller 350 is shown. The power controller 350 includes a base unit 352 and a control module 354 that is attached thereon. The base unit 352 may have or be coupled to another module that has a solid state relay, a heat sink, a controller, an integrated loop controller, a high current power switching device, a contactor, a voltage regulator or other device and be configured to mount within an electrical box. The base unit 352 has a base housing 356 and the control module 354 has a control module housing 358. The base housing 356 includes a control module cavity that is adapted to receive a lower portion 360 of the control module housing 358. As shown, the control module housing 358 defines the lower portion 360 that may also be adapted by keying or other formations, to couple to or seat within a receiving or coupling portion 362 of the base housing 356.

The control module housing 358 has flexible mating members 370 that are positioned and adapted to mate with one or more base fixtures 372 of the base housing 356. The flexible mating members 370 are on opposing sides of the control module housing 358. The flexible mating members 370 are releasable from the base fixtures 372 through applied lateral pressure thereon. The control module housing 358 may be adapted to fit more than one base housing or may be adapted to mount in more than one orientation in the base housing 358. Any number of mating members may be used to couple the control module housing 358 to the base housing 356.

The control module housing 358 has a connector member 380 that receives three block connectors 382. Two of the block connectors 382 are shown as eight-pin connectors and the third block connector 384 is a five-pin connector. The connector member 380 also has a feature portion 386 that provides for the incorporation of indicators and or other user interfacing elements.

The control module 354 may have electrical contact members 390 for connecting to and communicating with the base unit 352. The electrical contact members 390 may be disposed on the lower portion 360 and face the base unit 352. The electrical contact members 390 are configured for making electrical contact with a corresponding portion of the base unit 352 when the control module 354 is coupled to the base unit 352. Additionally, the control module 354 may include one or more sensors configured and positioned along the lower portion 360 to sense a characteristic associated with the operation of the control module 354 or base unit 352.

Referring to FIG. 12, an exploded and unassembled perspective view of the control module 354 is shown. The control module 354 includes the control module housing 358, a supervisor board 400, SPCBs 402, and the block connectors 382. Note that the SPCBs 402 may have the same electronic circuitry or electronic circuit thereon as the SPCBs 52 in FIG. 1. The difference with the SPCBs 402, as opposed to the SPCBs 52, is the shape factor and the relative location of the electronic circuits thereon. Use of the same electronic circuitry or electronic circuit across multiple products having different DIN assembly sizes reduces associated costs. This is described in further detail below. The control module housing 358 includes side members 404 and the connector member 380 that performs as a cover to the control module housing 358.

During assembly, the SPCBs 402 are connected to the supervisor board 400 via block headers 406 and the combination thereof is slid down into a circuit board cavity 408 formed by the side members 404. The block headers 406 may be the same or similar to the block headers 58. The connector member 380 is slid over terminals, such as the F-terminals 410 shown, on the SPCBs 402. Pins 412 of the F-terminals 410 are slid through pin holes 414 in the connector member 380. The pin holes 414 are shown in FIG. 16. The block connectors 382 are then inserted into respective slots 416 in the connector member 380.

The connector member 380 may be configured for releasably coupling to the control module housing 358, as shown. As illustrated, the connector member 380 may have tabs 420 that are inserted into the cavity and clip to the inner surfaces 422 of the side members 404 or may have other coupling members. The connector member 380, similar to the connecting portion 66, includes flexible connector retainers 424 that are configured for retaining the block connectors 382 in the slots 416.

Each SPCB 402 has an associated set of F-terminals, which allow the SPCBs 402 to be positioned in one of two orientations relative to the connector member 380 and the associated block connector. This allows for right hand or left and configuration of the circuit boards, which is different from traditional circuit board and controller assembly designs. Traditional circuit board and controller designs are configured for a single right or left hand orientation. The combination of these features provides for increased operational and design flexibility for the power control unit 354.

Figure 13:
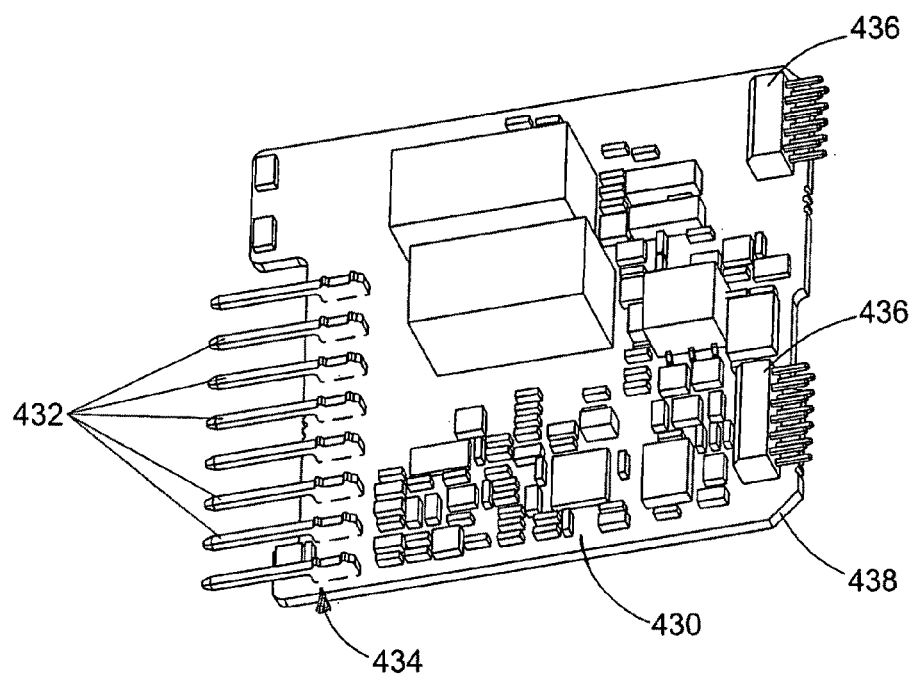
FIG. 13 is a top perspective view of a circuit board of the stand-alone power controller of FIG. 11.
Figure 14:
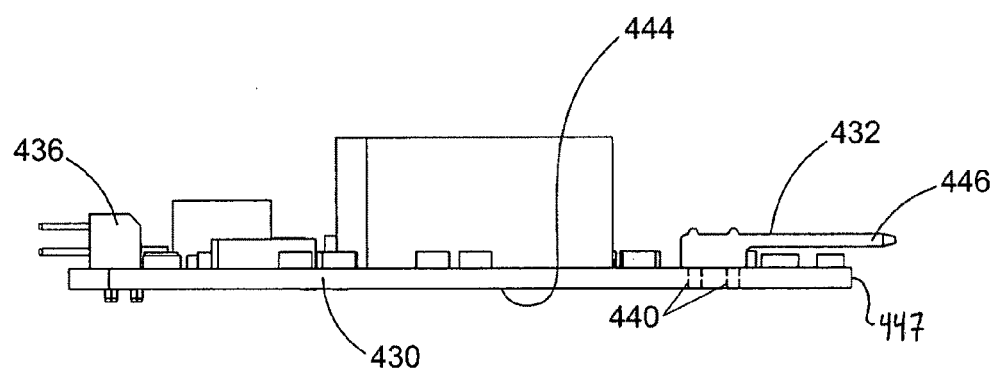
FIG. 14 is a side profile view of another circuit board of the stand-alone power controller of FIG. 11.
Figure 15:
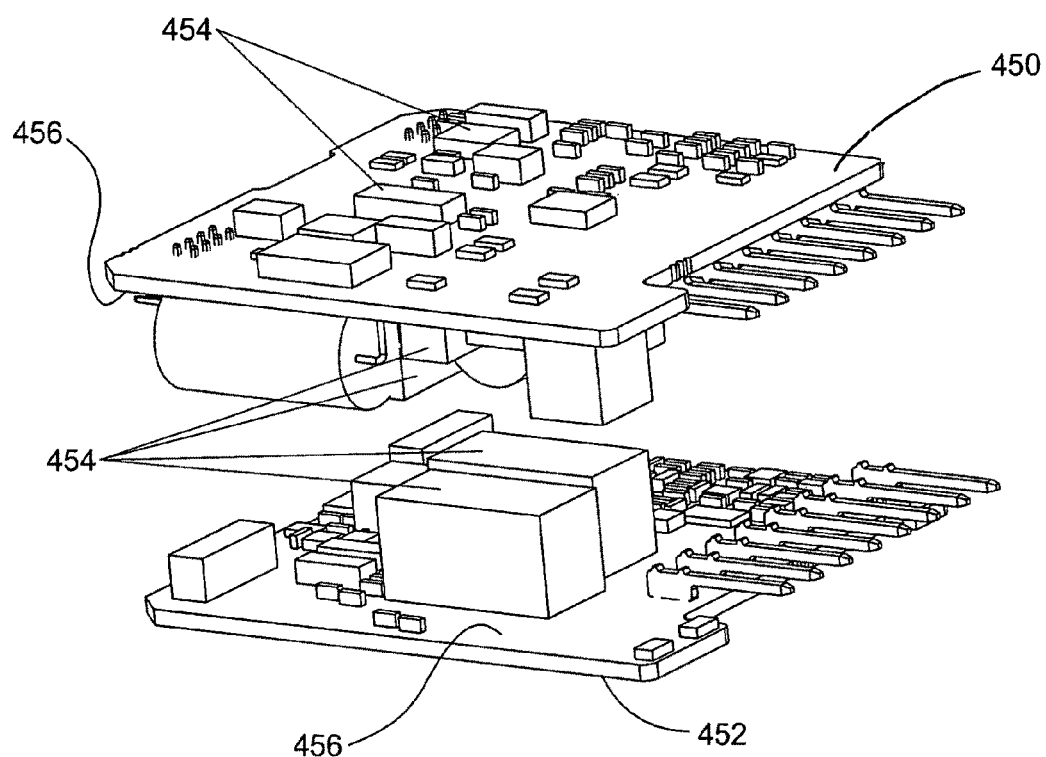
FIG. 15 is a perspective view of two circuit boards having different orientations of the stand-alone power controller of FIG. 11.

Referring to FIGS. 13-15, perspective views and a side profile view of another one of the SPCBs 402 in different orientations are shown. The SPCBs 402 may include solid-state circuit elements, analog elements, digital elements, power supply elements, temperature control elements, cooling elements, and other electrical and electronic circuit elements.

The SPCB 430 is left hand oriented. SPCBs that have F-terminals on a right side of a circuit board surface, when viewed on the F-terminal side of the circuit board with the pins of the F-terminals pointing in an upward direction, are described as having a right hand orientation. Similarly, SPCBs that have F-terminals on a left side of a circuit board surface are described as having a left hand orientation. The SPCB 430 has eight F-terminals 432 on a first end 434 and two block headers 436 on a second end 438. The F-terminals 432 have mounting posts 440 and pins 442. Note that the mounting posts 440 do not extend laterally out past a bottom surface 444 of the SPCB 430. Also, note that the pins 442 extend out past an outer periphery edge 446 of the SPCB 430.

In FIG. 15, a first SPCB 450 has a right hand orientation and a second SPCB 452 has a left hand orientation. Electronic components 454 are coupled to both sides of the first SPCB 450. The SPCBs 450, 452 are designed to be nested with each other. In other words, at least some of the electronic components 454 on the opposing sides 456 of the SPCBs 450, 452 are arranged to overlap and to not come in contact with each other when amounted in a package or housing assembly. The nesting of the components 454 allows the SPCBs 450 and 452 to be closely placed and mounted within a housing assembly. Components with a high-profile of a first SPCB, or that have a large extension away from a PCB, are matched with components on the second or opposing SPCB that have a low-profile.

Referring to FIG. 16-19, rear, front and side perspective views of the connector member 380 is shown. The connector member 380 couples between circuit boards, such as the SPCBs 402 and block connectors, such as the block connectors 382. The SPCBs 402 are positioned within a circuit board cavity and the block connectors 382 are positioned within the slots 416. In this manner, additional structural support and protection to the circuit boards and the terminals thereof is provided.

Figure 17:
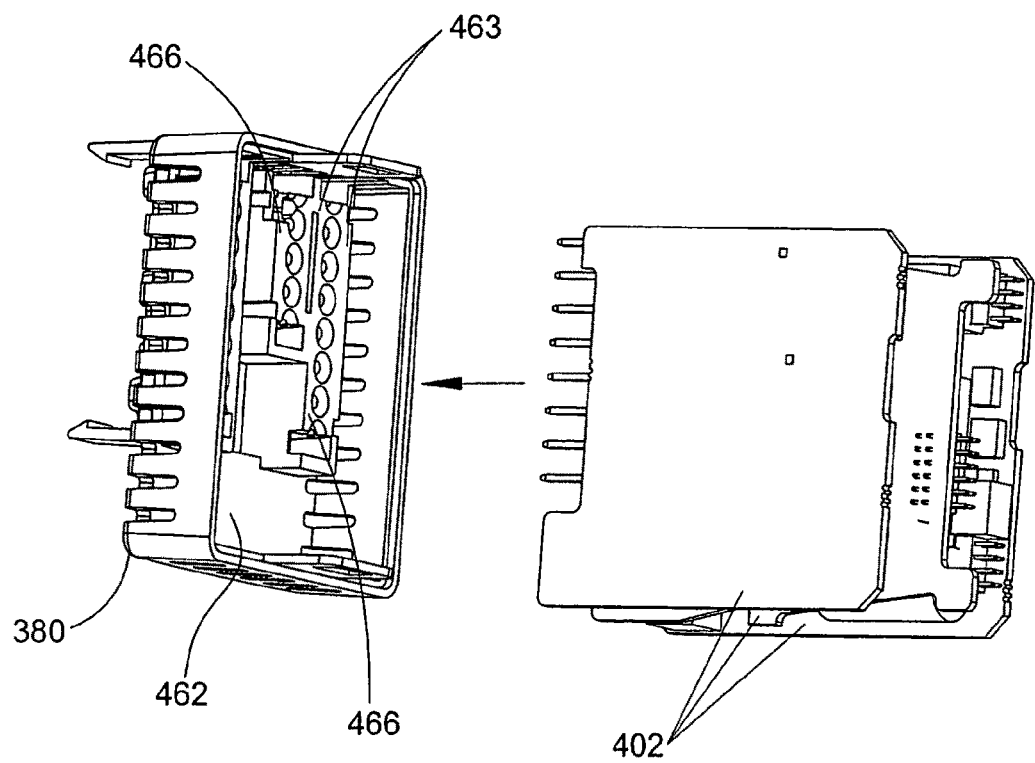
FIG. 17 is a front perspective view of the connector member of FIG. 16 illustrating a circuit board relationship therewith.
Figure 18:
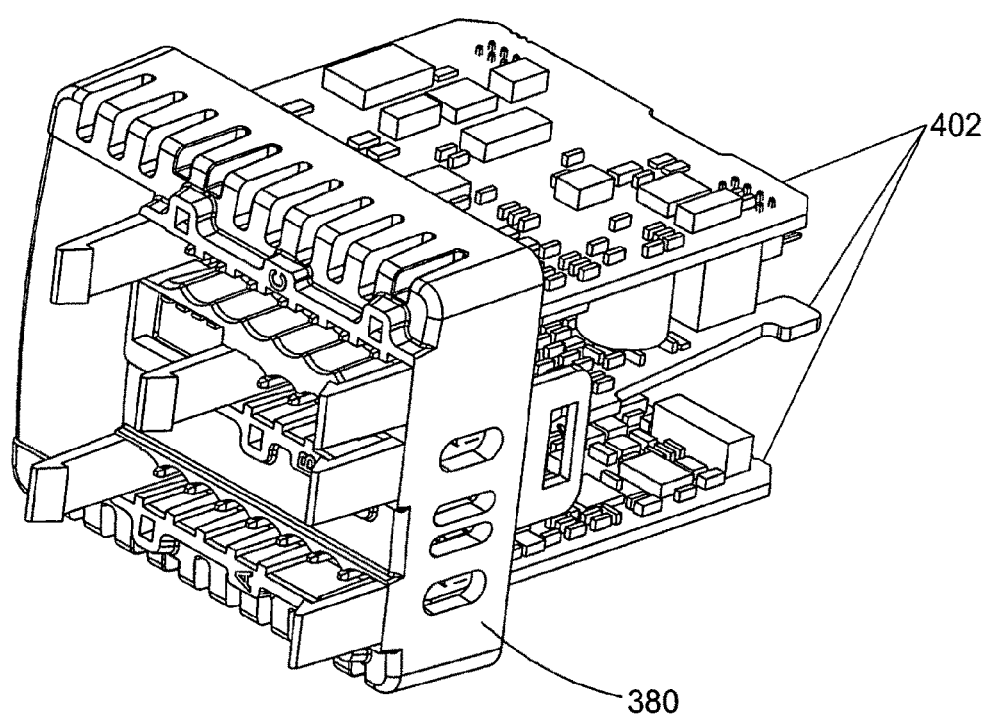
FIG. 18 is a front perspective view of the connector member of FIG. 16 illustrating a circuit board relationship therewith.
Figure 19:
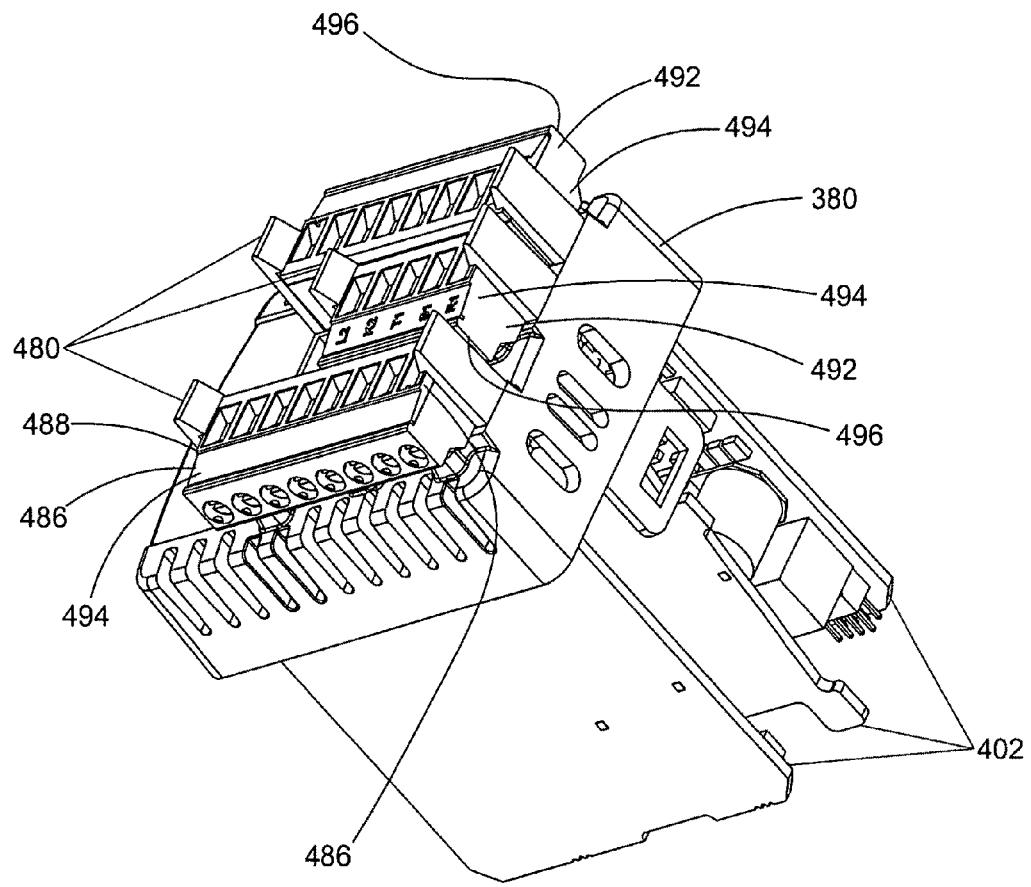
FIG. 19 is a side perspective view of the connector member of FIG. 16 illustrating a block connector coupling therewith.

The connector member 380 has a top surface 460 and a bottom surface 462. The top surface 460 includes the slots 416. The bottom surface 462 includes the pin holes 414 and has corresponding receptacles 463. The slots 416 have a first side 464 and a second side 466, which are shaped to correspond with and match the sides of a block connector, such as the sides 238, 240, 242 of FIG. 3. Each slot 416 has an associated set of electrical pin holes. First, second, and third pin hole sets 470, 472, 474 are shown. Each pin hole set 470, 472, 474 has an associated terminal set, which extends from one of the SPCBs 402 through the pin holes 414. FIG. 17 illustrates insertion of the terminals into the pin holes.

The connector member 380 also includes block connector retainer clips 480. A pair of connector retainer clips is associated with each slot. A pair of block connector holes is also associated with each slot. Subsequent to insertion of a block connector into an associated slot, a pair of flexible retainer clips is compressively engaged with outer ends of the block connector, such as ends 486 of block connector 488. The retainer clips 480 are associated with the slots 416 and are mounted on an exterior portion 490 of the connector member 380 and are adapted for securing block connectors. Other connector retainers may be used. For example, the retainer clips 480 can be defined by a portion of the connector member 380 or added as a strap or separate retainer. As another example, the retainer clips 480 may include one or more locking tabs configured to retain a block connector within the slots.

The connector member 380 further includes block connector holes 482, and air vent holes 484. The connector holes 482 receive block connector clips, such as the clips 250. The air vent holes 484 provide for air circulation and thermal energy exchange.

The relationship between the connector member 380 and block connectors 492 orientates adjacent block connectors 494 such that fasteners sides 496 thereof are directed in opposite directions. This allows for quick and easy insertion of electrical connecting elements or wiring termination. Space consumed by external wiring is also minimized and maintained in a focused area.

Similar modularity and configuration flexibility exists for rail mount assembly configurations. An example of which is provided below.

Referring to FIG. 20, a perspective view of multiple circuit board connection assemblies 500 that are installed on a common rail 502 is shown. In one embodiment, the circuit board connection assemblies 500 are configured to perform as and are collectively referred to as a power control system. The power control system configuration uses a modular control system, similar to the modular system 12, which provides additional space and improves controller configuration efficiencies.

The assemblies 500 include ten control circuit boards 504, two communication circuit boards 506 and a power supply circuit board 508. The boards 504, 506, 508 may be mounted on carriers 510, which are in turn attached to rail mounting brackets 512. The carrier 510 is similarly configured as the carrier 18 above. The brackets may have block headers or the like for coupling to the boards 504, 506, 508. The boards 504, 506, 508 may also be directly mounted to the brackets 512. This illustrative embodiment is not intended to limit the scope of the invention.

Figure 21:
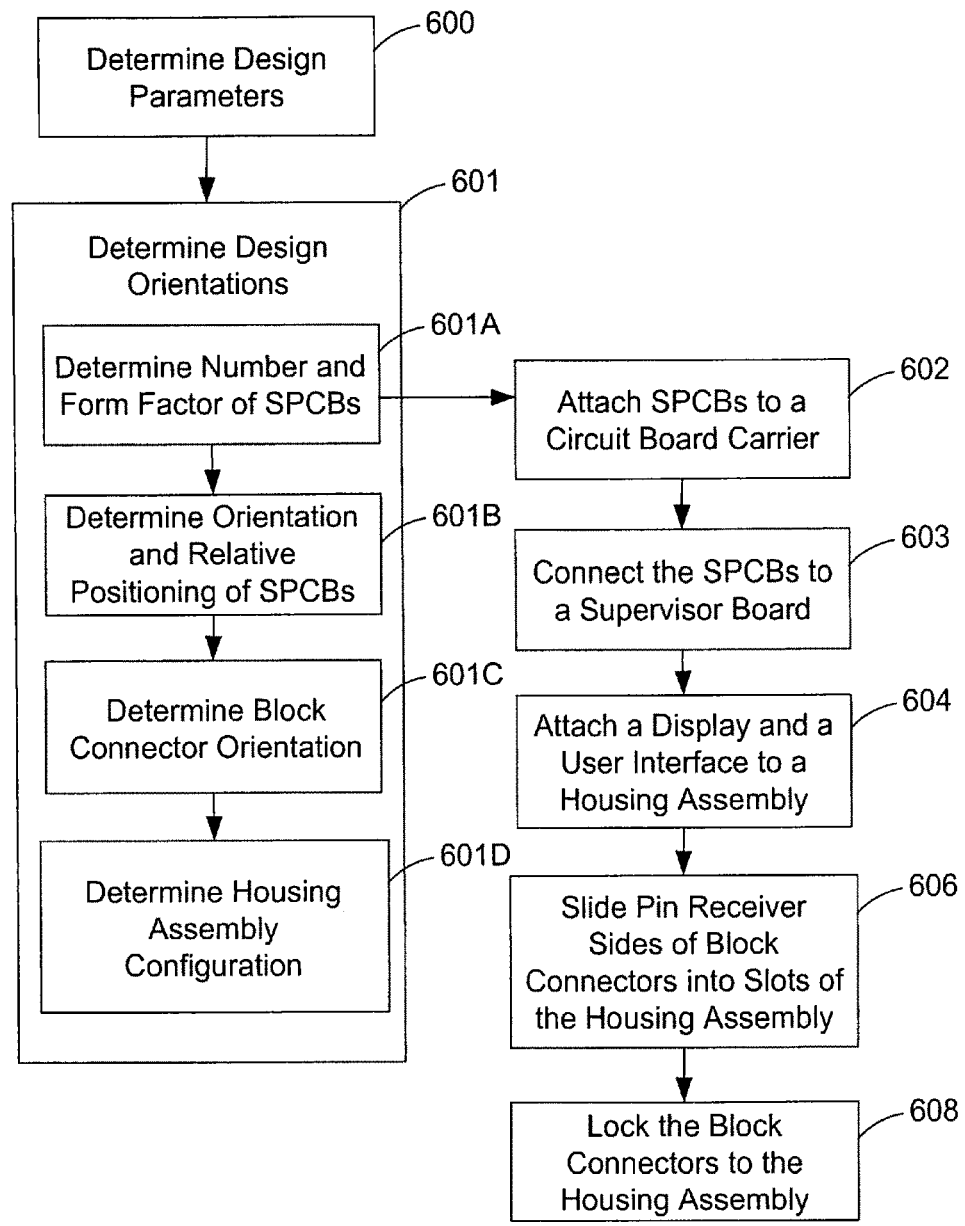
FIG. 21 is a flow diagram illustrating a method of assembly and manufacturing a modular control system.

Referring now to FIG. 21, a flow diagram illustrating a method of assembling and manufacturing a modular control system is shown. Although the following steps 600-620 are described primarily with respect to the embodiment of FIG. 1, the steps may be easily modified to be applied to other embodiments of the present disclosure.

In step 600, design parameters are determined, such as controller features and the number of desired SPCBs and block connectors. The size of a housing assembly may also be determined.

In step 601, a design orientation of the housing assembly, the SPCBs, and the block connectors, such as the housing assembly 50, the SPCBs 52, and the block connectors 55 is determined. The design orientation is determined based on the design parameters. The orientation of the housing assembly, the SPCBs, and the block connectors relative to each other is determined. Step 601 minimizes changes in circuitry and SPCB configurations and orientations across applications. In designing a controller, such as a panel-mount controller, for a given application the housing assembly configuration is often modified. Since modifications to the circuitry and SPCB design are minimal compared to modifications in the housing assembly, the described method directs a majority of any changes between products or applications to the housing assembly. This minimizes the number of different SPCBs or stock keeping units of measure (SKU) and allows for the development of new products using previously designed SPCBs.

In step 601A, the number and form factor of the SPCBs is determined. Same or similar SPCBs and same or similar SPCB circuitry configurations may be used across products having different DIN sizes. SPCBs may be mixed and matched and have the same or similar board and component nesting across multiple products and applications. The SPCBs are selected to have standardized circuitry when feasible for a particular application. A first level or degree of modularity may be referred to as use of the same SPCBs across multiple products and/or applications and/or having different package sizes. A second level or degree of modularity may be referred to as using the same circuitry across multiple products and/or applications and/or having different package sizes.

In step 601B, the orientation and relative positioning of the SPCBs is determined based on the form factor and the design parameters. The orientation and relative positioning may also be based on the spacing between block connectors and the profile of the circuit components incorporated on the SPCBs. The orientation and relative positioning may further be based on the space consumed by a carrier and the relation between the spatial relationships between the carrier, the SPCBs, and the associated housing assembly.

In step 601C, block connector orientation is determined based on the orientation and spacing of the SPCBs and the associated DIN size and/or outer dimension limitations of the application. The dimensions of the block connectors may stick out past the outer dimensions of a housing assembly. With a certain board and component nesting arrangement the block connectors have a corresponding orientation.

In step 601D, the configuration of the housing assembly is determined based on the above determinations. The exterior dimensions of the housing assembly are determined. The number, size, and orientation of the slots are determined. The interior configuration and dimensions of the housing assembly as pertaining to whether a carrier is used and the dimensions of that carrier are also determined. A third level or degree of modularity may be referred to as using the same housing assembly across multiple products and/or applications and/or having different package sizes.

In step 602, SPCBs are slid into guide channels of a circuit board carrier based on the selected design orientation. The SPCBs may be installed in the same or different orientation relative to each other.

In step 603, the SPCBs are connected to a supervisor board via block headers or via terminals. The terminals may be similar to the terminals 62.

In step 604, a display and user interface, such as the display 14 and the user interface 16 are attached to a housing assembly. For example, the supervisor board 22 may be placed on the carrier 18. The keypad 26 is placed on the supervisor board 22. The display cover 30 is placed over the supervisor board 22 and the frame 24, the SPCBs 52 are slid into the housing assembly 50, and the display cover is clipped onto the housing assembly 50. The orientation of the housing assembly relative to the SPCBs is based on the design orientations selected in step 601. As the SPCBs 52 are slid into the housing assembly the terminals 62 are pushed through the connecting portion 66. Installing a circuit board carrier may include aligning the circuit board carrier with orientation fixtures along an inner surface of a circuit board cavity of a housing assembly.

In step 606, pin receiver sides of the block connectors are pushed into slots of the housing assembly again based on the selected design orientation. This engages the terminals with the pin receivers.

In step 608, retainer clips, such as the retainer clips 84 lock the block connectors to the housing assembly.

Note that the SPCBs, the housing assembly, and the block connectors may be removed and reinstalled using a different design orientation. Also, each of the SPCBs may be mounted in a common or separate circuit board carrier configured for holding one or more circuit boards in predefined positions. The SPCBs may be installed on the circuit board carriers before or after they are installed in the housing assembly.

Figure 22:
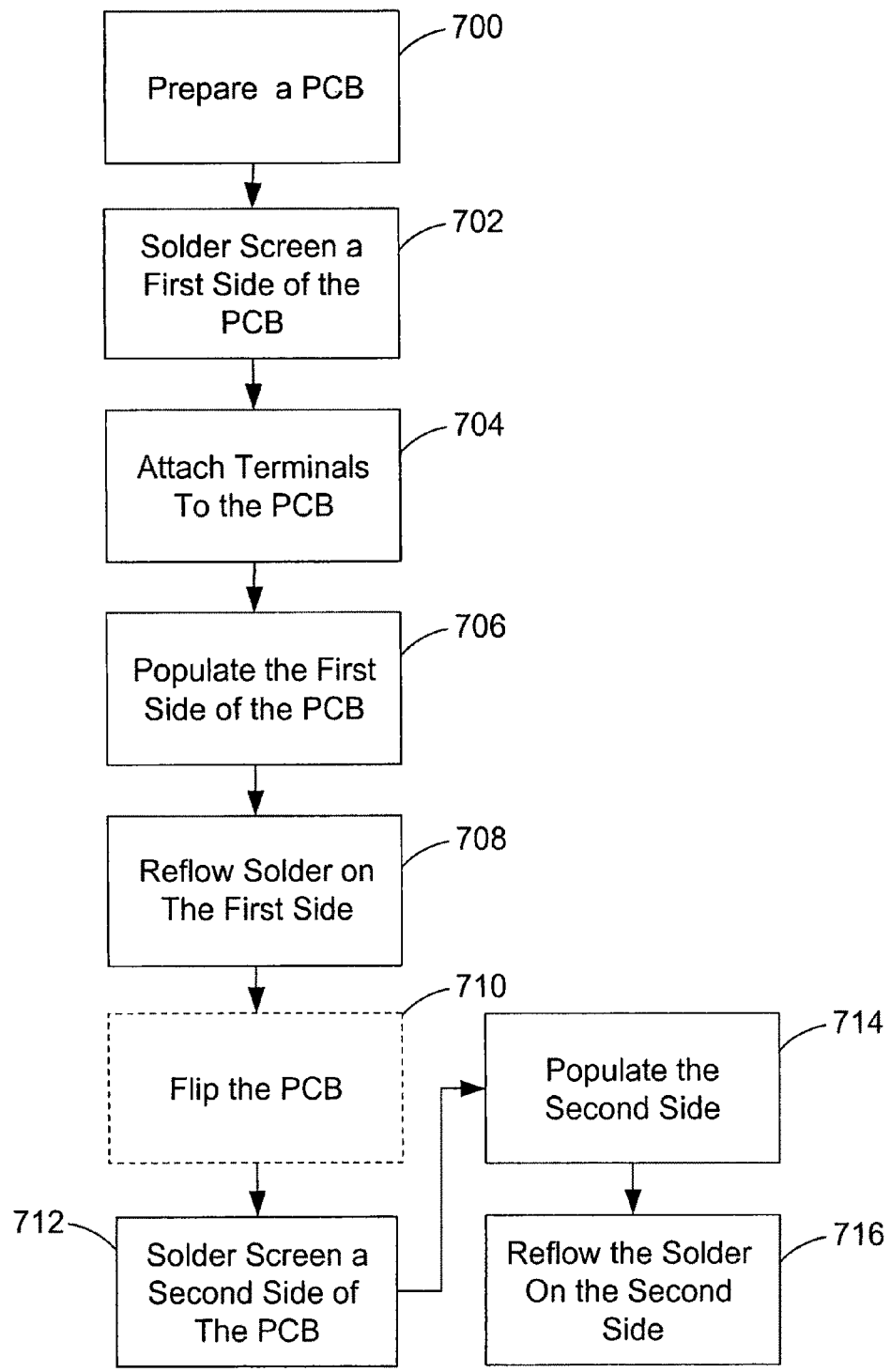
FIG. 22 is a flow diagram illustrating a method of manufacturing a circuit board according to another exemplary embodiment of the present disclosure.

Referring now to FIG. 22, a flow diagram illustrating a method of manufacturing a circuit board, such as a SPCB, is shown.

In step 700, a PCB is prepared, which may include silk screen printing, photoengraving, PCB milling, laminating, drilling, plating, coating, solder resisting, screen printing, testing, and other PCB preparing tasks.

In step 702, a solder paste is screened onto the PCB in areas of the PCB that are to be soldered. In step 704, terminals, such as F-terminals, are attached and/or press-fit onto the PCB. The attachment of the F-terminals prior to the attachment of other electrical components prevents and vibration or mechanical shock, due to terminal attachment, to affect or degrade other electrical components or connections that are on the PCB.

In step 706, the PCB is populated with electrical components other than the terminals. The electrical components may include the attachment of block headers, such as the block headers 58.

In step 708, the solder applied in step 702 is heated, which reflows the solder and provides electrical couplings between the PCB, the terminals, and the electrical components.

In step 710, the PCB may be flipped to allow for attachment of additional circuit elements on an opposite side as the circuit components previously applied in steps 704 and 706. In step 712, a solder paste is screened onto the opposite side in areas of the PCB that are to be soldered. In step 714, the additional circuit elements are layed out on the board and placed in assigned locations. In step 716, the solder applied in step 712 is reflowed to provide electrical couplings between the PCB and the additional circuit elements.

The above-described steps of FIGS. 21 and 22 are meant to be illustrative examples; the steps may be performed sequentially, synchronously, simultaneously, or in a different order depending upon the application.

The embodiments disclosed herein provide the ability to design and package circuit boards with improved interchangeability and compatibility between products and applications. Additionally, circuit board sizes can be standardized to enable packaging of the boards in either a right or left orientation based on the packaging or spacing needs of the particular circuit board implementation. In some cases, the circuit board assemblies and methods herein offer diverse assemblies that may be associated with a diverse electronic product line. The product line may utilize standardized circuit boards: that are adaptable and interchangeable across the product line; that are easy to assemble using standardized connectors; that are easy to maintain; and that have reduced implementation costs. The circuit board coupling assemblies and methods herein provide advantages to both manufacturers and end users. The disclosed embodiments allow for the use of standardized circuitry and components across multiple products having different form factors and packages sizes. This reduces production costs and provides feature enriched end products. These advantages include the stocking of fewer sub assembly circuit boards, faster assembly/disassembly of power controllers and easier field installation and maintenance of the power controllers.

The above-described embodiments reduce the number and type of components and parts needed for panel-mounted controllers, which reduces the associated production and stocking costs. The embodiments also provide modular assembly systems that allow for controller elements to be utilized in multiple applications through different orientations of the controller elements and/or minimally different configurations thereof.

Those skilled in the art will recognize that various changes can be made to the exemplary embodiments and implementations described above without departing from the scope of the invention. Accordingly, all matter contained in the above description or shown in the accompanying drawings should be interpreted as illustrative and not in a limiting sense. It is further to be understood that any processes or steps described herein are not to be construed as necessarily requiring their performance in the particular order discussed or illustrated. It is also to be understood that additional or alternative processes or steps may be employed.

Communications Protocols and Circuit Board Layouts

Figure 24:
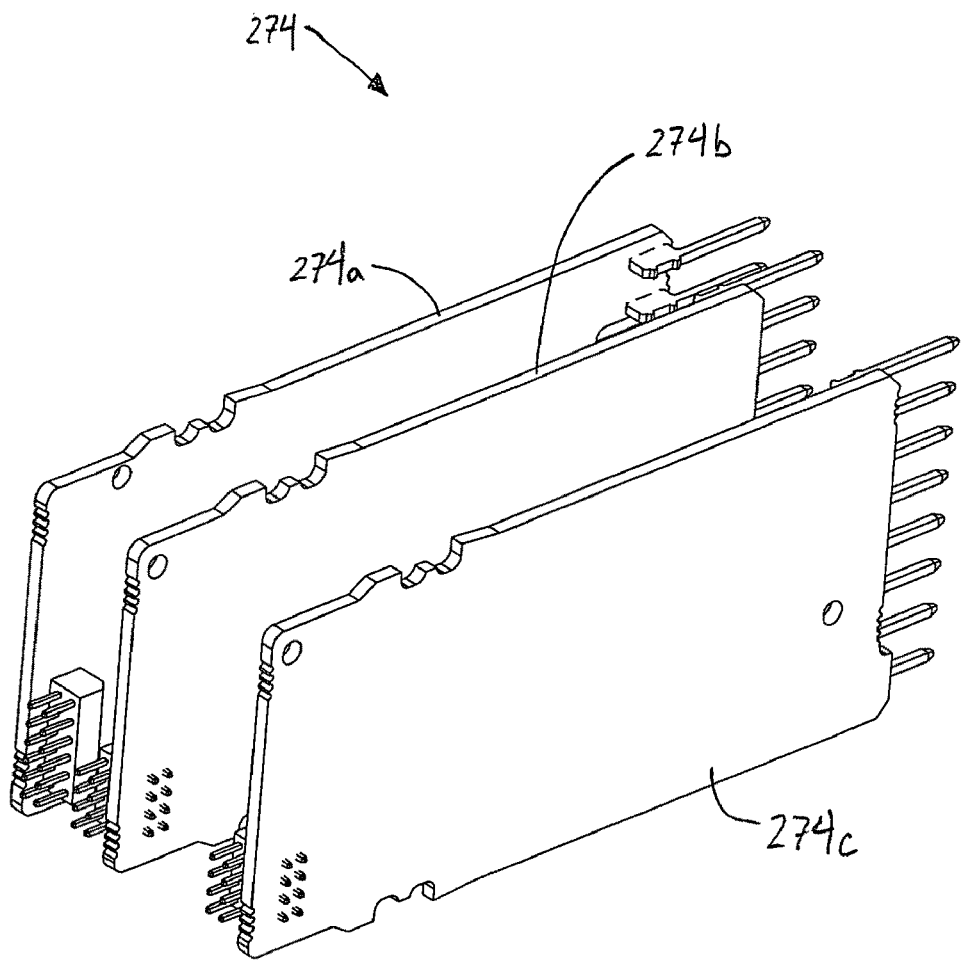
FIG. 24 is a perspective view of various circuit boards in accordance with the teachings of the present disclosure.
Figure 25:
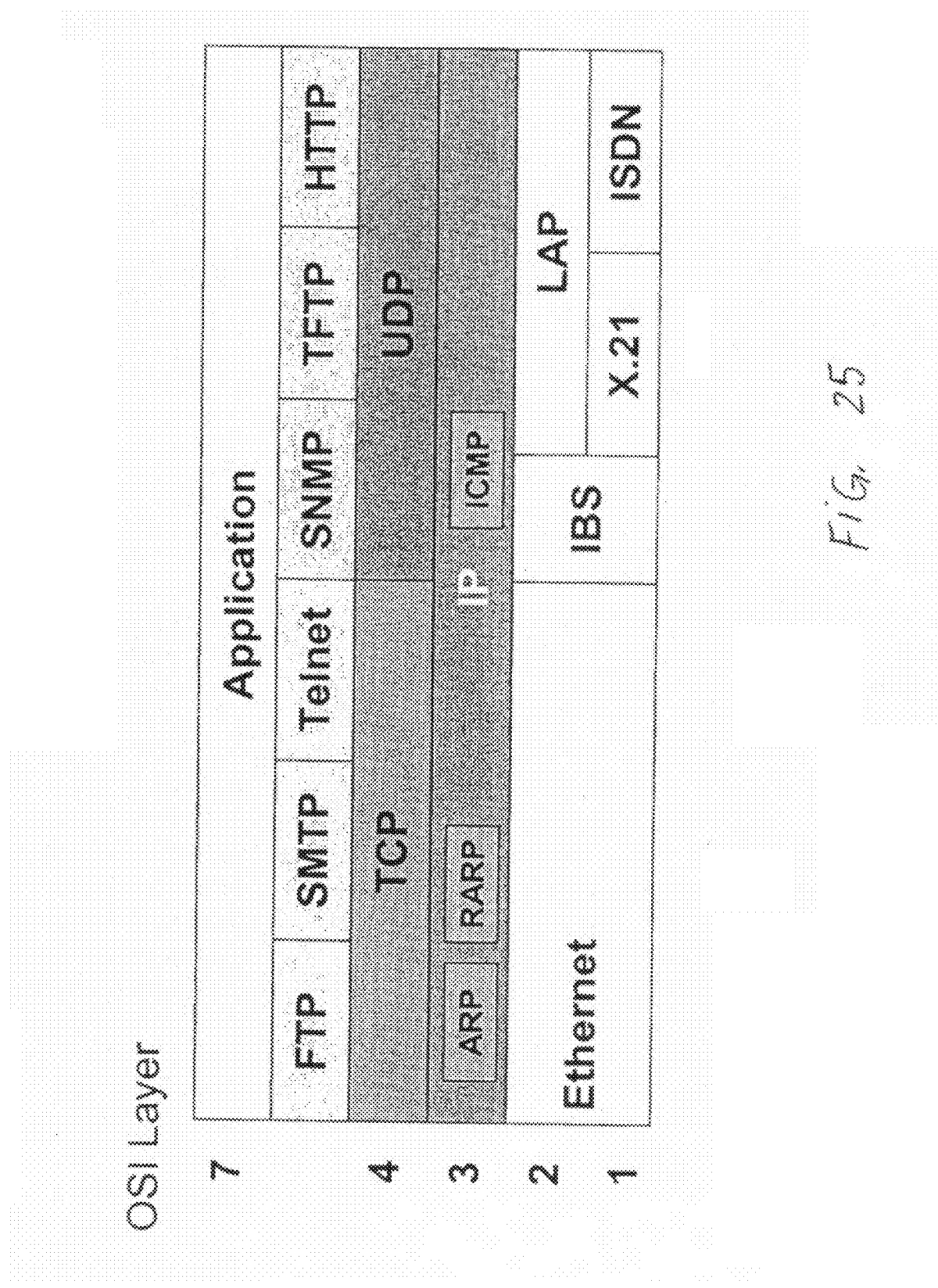
FIG. 25 is a diagram illustrating the OSI (Open Systems Interconnection) 7 layer model for communications and computer network protocol design.

Referring now to FIG. 24, the SPCBs 274 may be provided in a variety of types, including by way of example, a power supply circuit board 274a, a communications circuit board 274b, and a third circuit board 274c, the latter of which may be one of an I/O circuit board or a special function circuit board as described in greater detail below. In one embodiment, the communications circuit board 274b comprises Ethernet/IP and/or Modbus TCP protocols. Generally, Ethernet/IP is a communication network that uses the Common Industrial Protocol (CIP), which in turn uses Internet Protocol (IP), User Datagram Protocol (UDP), and Transmission Control Protocol (TCP) in the OSI 7 layer model as shown in FIG. 25. Therefore, the Ethernet/IP protocol is implemented at the network layer (IP) and the transport layer (UDP and TCP).

Modbus TCP is a communications protocol that is positioned at layer 7 of the OSI model and is implemented in the communications circuit board with the Ethernet/IP protocol as set forth above. In operation, this protocol allows, for example, communication of temperature to a microprocessor. It should be understood that a variety of communications protocols can be employed in accordance with the principles of the present disclosure. By way of example, in another form of the present disclosure, the communications circuit board 274b comprises RS-232 and RS-485 with Modbus RTU protocol. In yet other forms, the communications circuit board 274b comprises protocols such as DeviceNet, Profibus DP, CanOpen, EtherCat, Profinet, and USB. It should be understood that these protocols are merely exemplary, and other protocols which may arise in the future, are contemplated to be within the teachings of the present disclosure.

Heretofore, implementation of these protocols in a $\frac{1}{16}$ DIN controller has not been achieved in the art. With the combination of compact modular packaging, both mechanical and electrical, and software implementation for these protocols, the present disclosure provides new and advantageous communications for this size of power controllers.

In addition to the communications circuit board 274b, a third circuit board 274c may be included within the controller, and in one form, is disposed adjacent the communications circuit board 274b as shown in FIG. 24. The third circuit board 274c, in one form, may be a special function circuit board such as a safety limit with a universal input and two outputs, a motor drive, and a safety limit with multiple sensor inputs with a shared mechanical relay, among others. The third circuit board 274c, in another form, may be an I/O circuit board that comprises an input that is one of a universal input or a current transformer, and two outputs that are selected from the group consisting of a switched DC/open collector, a solid state relay, a mechanical relay, analog 1-10 volt, analog 0-20 mA, and a hybrid relay. In yet another form, the I/O circuit board comprises four inputs selected from the group consisting of thermocouples, RTDs, 0-10 volt, and 0-20 mA. Moreover, the I/O circuit board in another form comprises outputs selected from the group consisting of mechanical relays, solid state relays, switched DC/open collectors, 0-10 volt, and 0-20 mA. Other inputs to the I/O circuit board may include, by way of example, an encoder, a strain gauge, and a high speed counter.

It should be understood that other special function circuit boards and other inputs and outputs for the I/O circuit board may be employed while remaining within the scope of the present disclosure. Therefore, the specific exemplary embodiments as set forth herein should not be construed as limiting the scope of the present disclosure. Moreover, the principles of the present disclosure may also be applicable to DIN sizes other than the 1/16 size as disclosed herein such as the 1/32 DIN shown in FIG. 3, such that these other DIN sizes incorporate the communications protocols and/or the compact/modular packaging as set forth herein.

Figure 26:
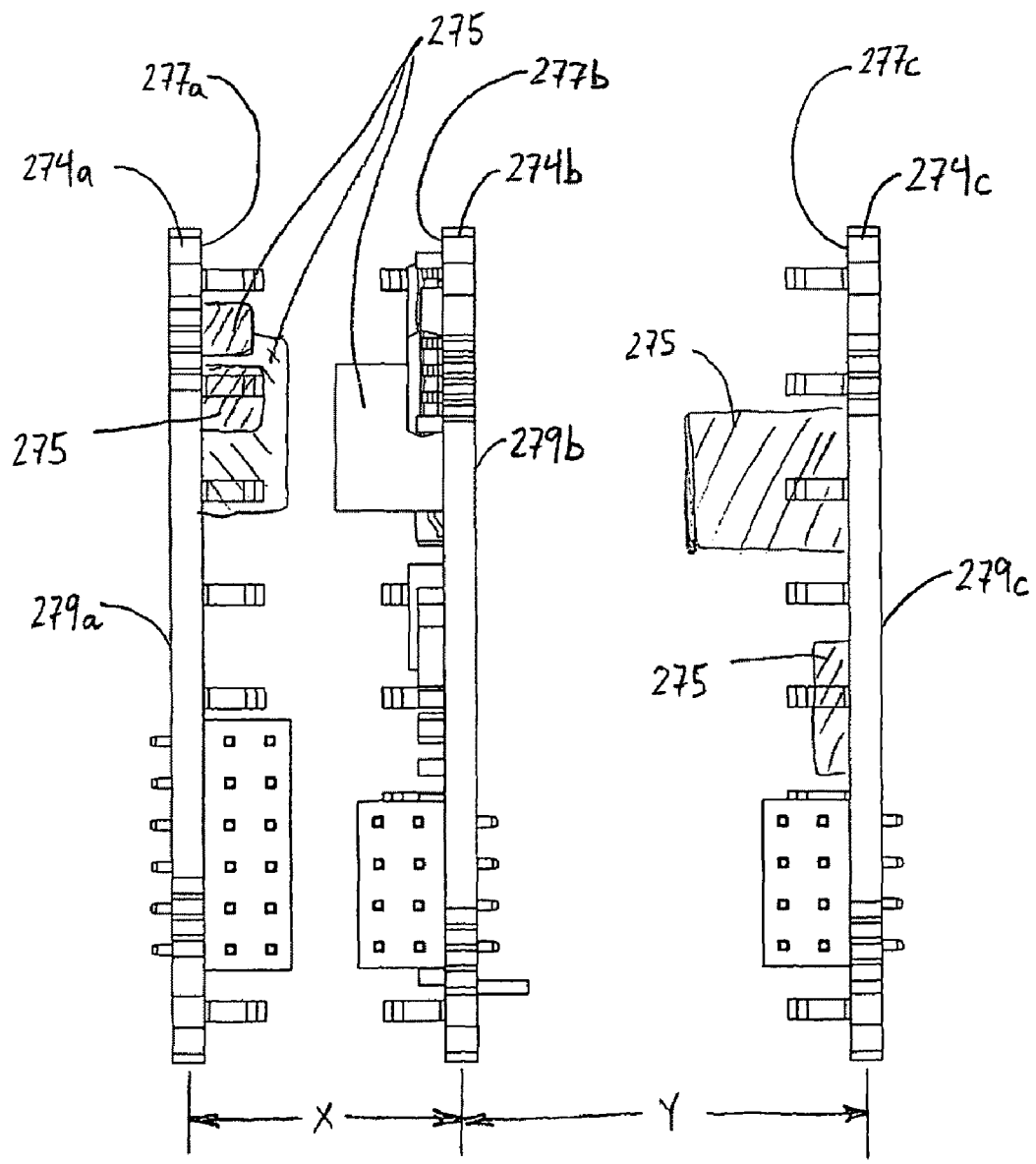
FIG. 26 is a front view of various circuit boards in accordance with the teachings of the present disclosure.

As shown in FIGS. 24 and 26, the communications circuit board 274b is disposed adjacent the power supply circuit board 274a, and the third circuit board 274c is disposed adjacent the communications circuit board 274b in one form of the present disclosure. Each of the circuit boards 274a, 274b, and 274c, and engaged by the circuit board carriers 280 as shown in FIG. 7, which is disposed within the housing 50 (FIG. 1). As further shown in FIG. 26, each of the circuit boards 274a, 274b, and 274c include a plurality of electronic components 275 that are nested together to form a compact assembly within the power controller 10 (not shown). As such, each of the circuit boards 274a, 274b, and 274c comprise an assembled surface 277a, 277b, and 277c, respectively, wherein the majority of electronic components 275 are mounted. Furthermore, the circuit boards 274a, 274b, and 274c also comprise a trimmed surface 279a, 279b, and 279c, respectively, where the majority of protrusions (i.e. connections, portions of electronic devices 275, solders, among others) are trimmed in order fit the circuit boards 274a, 274b, and 274c within the size constraints of a 1/16 DIN controller. In their assembled condition, the assembled surfaces 277a and 277b of the power supply circuit board 274a and the communications circuit board 274b face one another, and the assembled surface 277c of the third circuit board 274c faces the trimmed surface 279b of the communications circuit board 274b. As such, the trimmed surface 279c of the third circuit board 274c is disposed adjacent an outer portion of the power controller 10.

As further shown in FIG. 26, a spacing X between the power control circuit board 274a and the communications circuit board 274b is approximately half of a spacing Y between the communications circuit board 274b and the third circuit board 274c. It should be understood that the position of the circuit boards 274a, 274b, and 274c can be rearranged and are not limited to the specific positions as illustrated and described herein. For example, the third circuit board 274c may be positioned adjacent the power supply circuit board 274a, with the communications circuit board 274b being positioned adjacent the third circuit board 274c. (In other words, the communications circuit board 274b and the third circuit board 274c switch positions).

Figure 27:
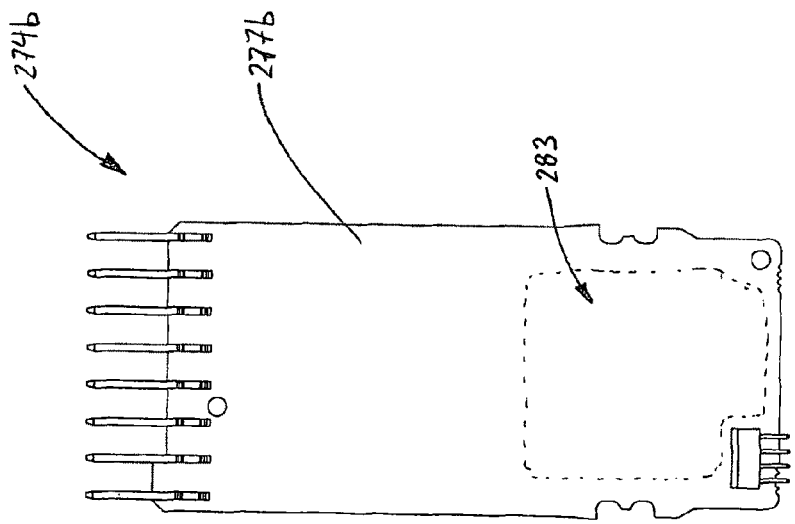
FIG. 27 is a plan view of a power supply circuit board and a communications circuit board constructed in accordance with the principles of the present disclosure.
Figure 27:
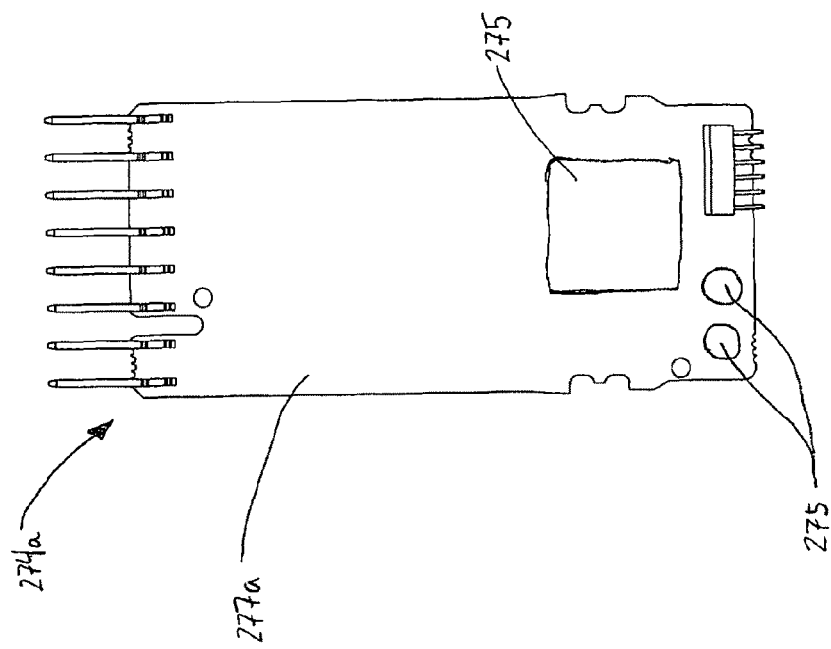

Referring now to FIG. 27, the assembled surfaces 277a and 277b of the power supply circuit board 274a and the communications circuit board 274b, respectively, are illustrated in greater detail. The power supply circuit board 274a has a plurality of electronic components 275 mounted thereon, some of which generate a relatively high amount of electrical transmissions in operation. (Only a few of the many electronic components 275 are illustrated for purposes of clarity). As such, the communications circuit board 274b defines an open area 283, which is substantially clear of electronic components and provides sufficient dielectric so that the electrical transmissions from the electronic components 275 on the power supply circuit board 274a do not damage or destroy any corresponding electronic components 275 on the communications circuit board 274b.

Although not shown herein, other types of connections for the communications circuit board 274b other than the F-terminals as illustrated and described herein may be provided. By way of example, an adaptor or a "pig-tail" is provided in another form with a more common Ethernet connection such as an RJ-45 connector. As such, the adaptor connects to the block connectors 55 (FIG. 1) at one end and includes the RJ-45 connection at the other end.

It should be understood that the description herein is merely exemplary in nature and, thus, variations that do not depart from the gist of the present disclosure are intended to be within the scope of the present disclosure. For example, the teachings herein with respect to different functionalities provided by the circuit boards (e.g., power supply, communications, special function, and I/O) can be provided through devices other than a circuit board, such as a flex circuit, while remaining within the scope of the present disclosure. Such variations are not to be regarded as a departure from the spirit and scope of the present disclosure.

What is claimed is:

1. A 1/16 DIN power controller comprising:
   a 1/16 DIN housing;
   a circuit board carrier disposed within the 1/16 DIN housing and capable of engaging at least three circuit boards within the 1/16 DIN housing;
   a power supply circuit board disposed within the 1/16 DIN housing and engaged by the circuit board carrier; and
   a communications circuit board disposed adjacent the power supply circuit board within the housing and engaged by the circuit board carrier;
   wherein each of the power control circuit board, the communications circuit board, and the third circuit board each comprise a plurality of electronic components mounted thereon, wherein the electronic components are nested together to form a compact assembly within the power controller; and wherein a spacing between the power control circuit board and the communications circuit board is approximately half of a spacing between the communications circuit board and the third circuit board.

2. The 1/16 DIN power controller according to claim 1, wherein the communications circuit board comprises at least one of Ethernet/IP and Modbus TCP protocols.

3. The 1/16 DIN power controller according to claim 1, wherein the communications circuit board comprises RS-232 and RS-485 with Modbus RTU protocol.

4. The 1/16 DIN power controller according to claim 1, wherein the communications circuit board comprises a protocol selected from the group consisting of DeviceNet, Profibus DP, CanOpen, EtherCat, Profinet, and USB.

5. The 1/16 DIN power controller according to claim 1, further comprising a third circuit board disposed adjacent the communications circuit board.

6. The 1/16 DIN power controller according to claim 5, wherein the third circuit board is selected from the group consisting of a special function circuit board and an I/O circuit board.

7. The 1/16 DIN power controller according to claim 6, wherein third circuit board is the special function circuit board and the special function circuit board is selected from a group consisting of a safety limit with a universal input and two outputs, a motor drive, and a safety limit with multiple sensor inputs with a shared mechanical relay.

8. The 1/16 DIN power controller according to claim 6, wherein third circuit board is the I/O circuit board and the I/O circuit board comprises:
   an input that is one of a universal input or a current transformer; and
   two outputs that are selected from the group consisting of a switched DC/open collector, a solid state relay, a mechanical relay, analog 1-10 volt, analog 0-20 mA, and a hybrid relay.

9. The 1/16 DIN power controller according to claim 6, wherein third circuit board is the I/O circuit board and the I/O circuit board comprises four inputs selected from the group consisting of thermocouples, RTDs, 0-10 volt, and 0-20 mA.

10. The 1/16 DIN power controller according to claim 6, wherein third circuit board is the I/O circuit board and the I/O circuit board comprises outputs selected from the group consisting of mechanical relays, solid state relays, switched DC/open collectors, 0-10 volt, and 0-20 mA.

11. The 1/16 DIN power controller according to claim 6, wherein third circuit board is the I/O circuit board and the I/O circuit board comprises an input selected from the group consisting of an encoder, a strain gauge, and a high speed counter.

12. A 1/16 DIN power controller comprising a power control circuit board, a communications circuit board disposed adjacent the power control circuit board, the communications circuit board comprising at least one of Ethernet/IP and Modbus TCP protocols, and a third circuit board disposed adjacent the communications circuit board, the power control circuit board, the communications circuit board, and the third circuit board being enclosed in a 1/16 DIN housing;
wherein each of the power control circuit board, the communications circuit board, and the third circuit board each comprise a plurality of electronic components mounted thereon, wherein the electronic components are nested together to form a compact assembly within the power controller; and wherein a spacing between the power control circuit board and the communications circuit board is approximately half of a spacing between the communications circuit board and the third circuit board.

13. The 1/16 DIN power controller according to claim 12, wherein the third circuit board is selected from the group consisting of a special function circuit board and an I/O circuit board.

14. A 1/16 DIN power controller comprising a power control circuit board, a communications circuit board disposed adjacent the power control circuit board, the communications circuit board comprising at least one of Ethernet/IP and Modbus TCP protocols, and a third circuit board disposed adjacent the communications circuit board, the power control circuit board, the communications circuit board, and the third circuit board being enclosed in a 1/16 DIN housing;
wherein each of the power control circuit board, the communications circuit board, and the third circuit board each comprise an assembled surface wherein the majority of electronic components are mounted and a trimmed surface opposite the assembled surface; and wherein a spacing between the power control circuit board and the communications circuit board is approximately half of a spacing between the communications circuit board and the third circuit board.

15. The 1/16 DIN power controller according to claim 14, wherein the assembled surfaces of the power control circuit board and the communications circuit board face one another.

16. The 1/16 DIN power controller according to claim 14, wherein the assembled surface of the third circuit board faces the trimmed surface of the communications circuit board.

17. The 1/16 DIN power controller according to claim 14, wherein the trimmed surface of the third circuit board is disposed adjacent an outer portion of the power controller.

* * * * *